(12) United States Patent
Matsui et al.

(10) Patent No.: US 7,408,184 B2
(45) Date of Patent: Aug. 5, 2008

(54) FUNCTIONAL MOLECULAR ELEMENT AND FUNCTIONAL MOLECULAR DEVICE

(75) Inventors: Eriko Matsui, Kanagawa (JP); Oliver Harnack, Stuttgart (DE); Nobuyuki Matsuzawa, Stuttgart (DE); Akio Yasuda, Esllingen (DE)

(73) Assignee: Sony Corporation, Tokyo (JP)

( * ) Notice: Subject to any disclaimer, the term of this patent is extended or adjusted under 35 U.S.C. 154(b) by 35 days.

(21) Appl. No.: 10/540,237

(22) PCT Filed: Dec. 25, 2003

(86) PCT No.: PCT/JP03/16819

§ 371 (c)(1),
(2), (4) Date: Jul. 19, 2005

(87) PCT Pub. No.: WO2004/059756

PCT Pub. Date: Jul. 15, 2004

(65) Prior Publication Data

US 2006/0081838 A1 Apr. 20, 2006

(30) Foreign Application Priority Data

Dec. 25, 2002 (JP) .............................. 2002-373973

(51) Int. Cl.
*H01L 51/30* (2006.01)

(52) U.S. Cl. .......... 257/40; 257/E51.023; 257/E51.024; 365/151; 977/731; 977/791; 977/940; 977/943

(58) Field of Classification Search .................... 257/40, 257/E51.023, E51.024; 365/151; 977/731, 977/791, 938, 940, 943
See application file for complete search history.

(56) References Cited

U.S. PATENT DOCUMENTS

| | | | | |
|---|---|---|---|---|
| 4,109,241 A | * | 8/1978 | Shanks | ......................... 345/95 |
| 5,608,556 A | * | 3/1997 | Koma | ......................... 349/143 |
| 6,128,214 A | | 10/2000 | Kuekes et al. | |
| 6,256,767 B1 | | 7/2001 | Kuekes et al. | |
| 6,674,932 B1 | * | 1/2004 | Zhang et al. | .................. 385/16 |
| 2002/0040805 A1 | * | 4/2002 | Swager | .................. 174/110 A |
| 2002/0114557 A1 | | 8/2002 | Zhang et al. | |

FOREIGN PATENT DOCUMENTS

| | | |
|---|---|---|
| JP | 2003-209305 | 7/2003 |
| JP | 2003-418815 | 1/2008 |

OTHER PUBLICATIONS

Chen et al., "Large On-Off Ratios and Negative Differential Resistance in a Molecular Electronic Device," Science, 1999, vol. 286, 1550-1552.

Feringa, Ben L., "Molecular Switches," Wiley-VCH, Weinheim, 2001.

(Continued)

*Primary Examiner*—Richard T. Elms
*Assistant Examiner*—Michael Lulis
(74) *Attorney, Agent, or Firm*—Bell, Boyd & Lloyd LLP

(57) ABSTRACT

A functional molecular element whose functions can be controlled by an electric field based on a new principle. A Lewis base molecule (14) with positive permittivity anisotropy or a dipole moment in the major axis direction of the molecule is disposed, via a metal ion (3) that can act as a Lewis acid, in a pendant-like form on a key molecule (2) in the form of a line or film that has a conjugated system and exhibits conductivity, thereby forming a functional molecular element 1 that can realize a function where the conformation changes due to the application of an electric field. The conductive key molecule (2) and the Lewis base molecule (14) form a complex with the metal ion (3). When an electric field is applied in a direction perpendicular to the plane of the paper in FIG. 1(*b*), for example, the Lewis base molecule (14) performs a 90° "neck twisting" movement with the up-down direction in the drawing as the axis. Also, when an electric field is applied in the up-down direction in the drawing as shown in FIG. 1(*c*), the Lewis base molecule (14) performs a "see-saw" movement with the direction perpendicular to the plane of the paper as the axis, thereby switching the conductivity of the conductive key molecule (2).

13 Claims, 15 Drawing Sheets

OTHER PUBLICATIONS

Reed et al., "Conductance of a Molecular Junction," Science, 1997, vol. 278, 252-254.

Ashton et al., "A Three-Pole Supramolecular Switch," J. Am. Chem. Soc., vol. 121, pp. 3951-3957, 1999.

* cited by examiner (a)

(b)     (C)

Dihedral Angle α (Degree) Between Pyrrole Rings in Polypyrrole

Relative Angle θ (Degree)

θ = 130°, α = 5°
Low Resistance State

θ = 50°, α = 17°
High Resistance State

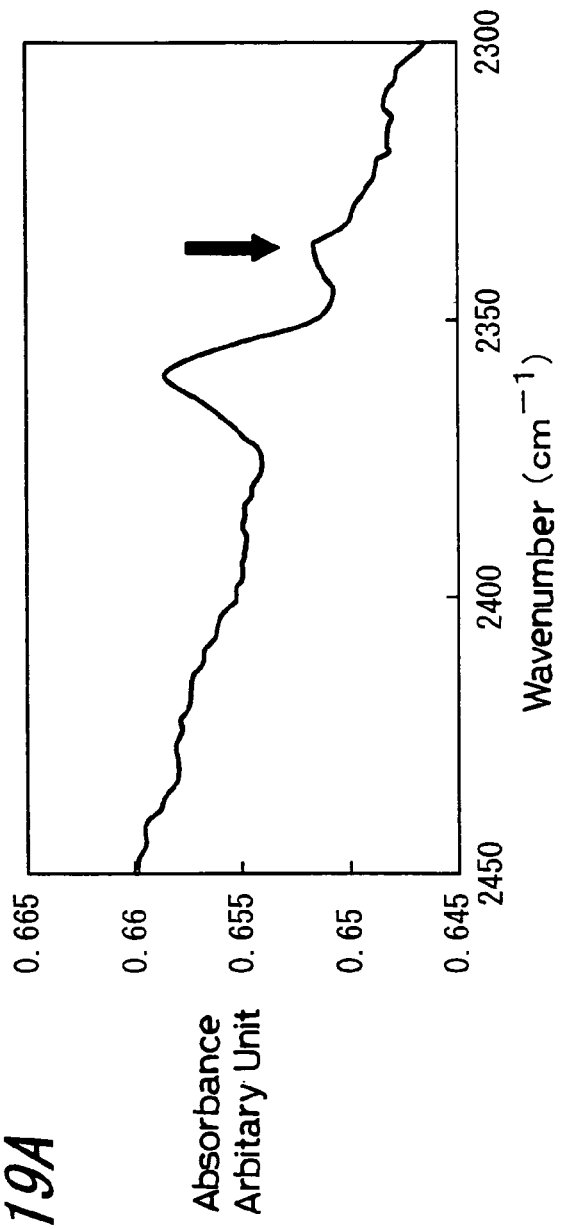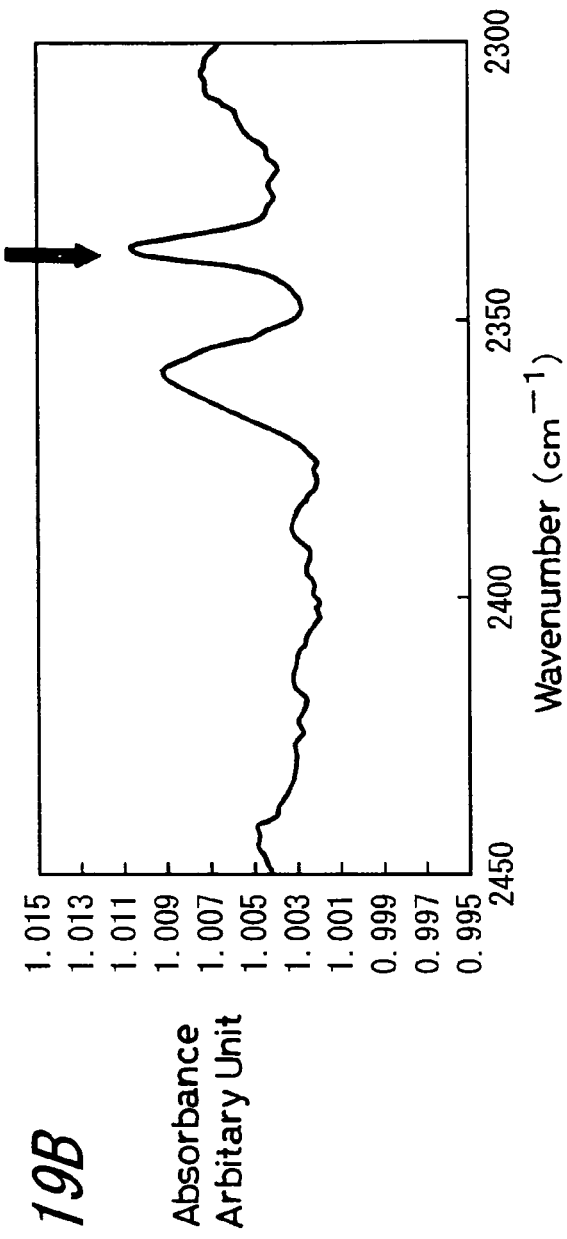
FIG. 19A
FIG. 19B

FUNCTIONAL MOLECULAR ELEMENT AND FUNCTIONAL MOLECULAR DEVICE

TECHNICAL FIELD

The present invention relates to a new functional molecular element and functional molecular device that can realize a function when acted upon by an electric field.

BACKGROUND ART

"Nanotechnology" refers to technologies that observe, fabricate, and utilize minute structures of around one hundred-millionth of a meter ($10^{-8}$m=10 nm) in size.

High-precision microscopes called "scanning tunnel microscopes" were invented in the latter half of the 1980s, thereby making it possible to see single atoms and single molecules. By using a "scanning tunnel microscope", it is possible not only to observe atoms and molecules, but also to manipulate individual atoms and molecules.

For example, there have been reported examples where atoms are arranged on the surface of a crystal to write characters. However, although it is possible to manipulate atoms and molecules, it is not realistic to individually manipulate a huge number of atoms and/or molecules to assemble a new material or device.

To form a structure of nanometer size by manipulating atoms, molecules, or groups thereof, new ultraprecise machining technology capable of such manipulation is required. As ultraprecise machining technology with nanometer precision, methods that can be roughly classified into two types are known.

A first of these technologies has conventionally been used in the manufacturing of various semiconductor devices, and is a so-called "top-down" method where for example a large silicon wafer is precisely carved to the smallest possible extent to produce integrated circuits in the silicon. The other technology is a so-called "bottom up" method where microscopic units such as atoms and molecules are the components and the desired nanostructures are fabricated by assembling such small components.

For the top-down method, the well-known "Moore's Law" announced in 1965 by the cofounder of Intel Corp. Gordon Moore exists regarding the limit on how small structures can be fabricated. Moore's Law states that transistor density doubles every eighteen months. Since 1965, the semiconductor industry has raised the transistor density in keeping with Moore's Law for more than thirty years.

The International Technology Roadmap for Semiconductors (ITRS) for the semiconductor industry in the coming fifteen year period that has been announced by the Semiconductor Industry Association (SIA) expresses the opinion that Moore's Law will continue to be valid.

The ITRS is composed of a short-term roadmap to the year 2005 and a long-term roadmap to the year 2014. In the short-term roadmap, the process rule of semiconductor chips will reach 100 nm and the gate length of microprocessors will reach 65 nm in 2005. In the long-term roadmap, the gate length in 2014 will reach 20 to 22 nm.

As semiconductor chips become miniaturized, the processing speed increases and at the same time power consumption is suppressed. In addition, the number of products that can be produced from a single wafer increases, so that the manufacturing cost also falls. For these reasons, microprocessor manufacturers are competing to improve the process rule and transistor density of new products.

In November 1999, a research group in the USA announced breakthrough results for miniaturization technology. This breakthrough was a method of designing gates on a FET (Field Effect Transistor) called "FinFET" that was developed by a group led by Professor Chenming Hu, Head of Computer Science at the University of California, Berkeley. This method makes it possible to form four hundred times as many transistors on a semiconductor chip compared to conventional methods.

A gate is an electrode that controls the flow of electrons in a FET channel, with current designs typically having a structure where the gate is disposed in parallel with the surface of a semiconductor and controls the channel from one side thereof. With this structure, it is not possible to shut off the flow of electrons unless the gate has at least a predetermined length, and therefore gate length has been thought of as one factor limiting the miniaturization of transistors.

On the other hand, with FinFET technology, a gate has a fork shape so as to straddle both sides of the channel and so can effectively control the channel. With a FinFET structure, the gate length and transistor can be made even smaller than conventional structures.

The gate length of a plot-type FET manufactured by the above research group is 18 nm, which is around one tenth of the current typical gate length and matches the year 2014 size given in the long-term roadmap of the ITRS. The research also states that half of this gate length is possible. Professor Hu's group has not applied for patents in expectation that the technology will be widely adopted by the semiconductor industry, and so FinFET may become the principal manufacturing technology.

However, "Moore's Law" also states that a limit will eventually be reached due to natural laws.

For example, according to current mainstream semiconductor technology, a circuit pattern is burnt into a silicon wafer by lithography to manufacture semiconductor chips. To achieve further miniaturization, the resolution needs to be raised, but to raise the resolution, it is necessary to realize technology that uses light of a shorter wavelength. Since there is a physical limit on the wavelength of the light used in lithography, a breakthrough from another angle is required to exceed this limit.

Also, when the packing density is increased, there is also the risk of the amount of heat emitted per semiconductor chip becoming too large, causing the semiconductor chips that have reached a high temperature to malfunction or to become thermally damage.

In addition, according to predictions made by specialists, it is believed that if the semiconductor industry continues to reduce the size of chips, there will be a large increase in equipment costs and process costs, and yields will also worsen, making the manufacturing of chips economically unfeasible in around 2015.

In this way, as a new technology that can break through the technical wall facing the top-down method described above, attention has been focused on research that provides individual molecules with functions as electronic components. Electronic devices (molecular switches and the like) composed of single molecules are fabricated using the bottom-up method.

Research that produces nanometer-sized structures using the bottom-up method is being carried out for metals, ceramics, and semiconductors. However, there are several million types of molecules that have different shapes and different functions and are fundamentally independent from one another, and by utilizing such molecules, using the bottom-up method it is possible to design and fabricate devices (molecular devices) with completely different characteristics to conventional devices.

For example, the width of conductive molecules is just 0.5 nm. A wire material of such molecules can realize wires of several thousand times the density compared to the width of wires (around 100 nm) realized by current integrated circuit technology. Also, as one example, if a single molecule is used as a memory element, it is possible to record 10,000 times or more than a DVD.

Unlike conventional semiconductor silicon, molecular devices are synthesized by a chemical process. In 1986, Hiroshi Koezuka of Mitsubishi Electric discovered the world's first organic transistor made of polyolefin (a polymer).

In addition, a research group composed of Hewlett Packard (HP) Corp. and the University of California at Los Angeles (UCLA) succeeded in manufacturing an organic electronic device and in addition to announcing their results in "Science" Magazine (July 1999 edition) applied for patents (See U.S. Pat. No. 6,256,767B1 and U.S. Pat. No. 6,128,214). This research group produced switches using a molecule film composed of several million organic rotaxane molecules, and by connecting these molecular switches, fabricated AND gates that are fundamental logic circuits.

A collaborative research group of Rice University and Yale University succeeded in producing a molecular switch that carries out a switching operation where the molecular structure is changed by introducing electrons when an electric field is applied, and announced their results in the November 1999 edition of "Science" Magazine (see J. Chen, M. A. Reed, A. M. Rawlett and J. M. Tour, "Large On-Off Ratios and Negative Differential Resistance in a Molecular Electronic Device", Science, 1999, Vol. 286, 1552-1551 and J. Chen, M. A. Reed, C. Zhou, C. J. Muller, T. P. Burgin and J. M. Tour, "Conductance of a Molecular Junction", Science, 1997, Vol. 278, 252-254). A function whereby the device can be repeatedly turned on and off was not realized by the HP/UCLA group. This is a basis for producing a small, high performance computer with one millionth of the size of a normal transistor.

Professor J. Tour (Rice University, Chemistry Department) succeeded in synthesis and has made it possible to reduce the manufacturing cost of a molecular switch to one several thousandth of the conventional cost by making the costly clean room used in conventional semiconductor manufacturing unnecessary. It is expected that hybrid computers composed of molecules and silicon will be manufactured within five to ten years.

In 1999, Bell Labs (Lucent Technology) fabricated an organic thin-film transistor with a pentacene single crystal that exhibits characteristics that match those of an inorganic semiconductor.

Even though much research is being conducted into molecular devices that function as electronic components, the research conducted into molecular devices so far has mostly been into devices driven by light, heat, protons, ions, or the like (see, for example, "Molecular Switches", edited by Ben L. Feringa, WILEY-VCH, Weinheim, 2001), and research into devices driven by electric fields has been limited.

As conventional molecular elements driven by an electric field, there are only elements that use changes in the solid-state properties of the molecules themselves upon which the electric field has acted, that is, elements where the molecules themselves are thought of as single elements and the electron state of the molecules is changed by the electric field. For example, with an organic FET, by changing the electric field that acts upon organic molecules in the channel region, carrier mobility in the organic molecules is modulated.

In view of the situation described above, it is an object of the present invention to provide a functional molecular element and a functional molecular device whose functions can be effectively controlled by an electric field based on a new principle.

DISCLOSURE OF THE INVENTION

That is, the present invention relates to a first functional molecular element including a molecule with permittivity anisotropy and/or a dipole moment; a metal ion; and a conjugated molecule, wherein the molecule with permittivity anisotropy and/or the dipole moment and the conjugated molecule form a complex with the metal ion and also to a second functional molecular element that uses: a system where a π-conjugated system changes according to a change in molecular structure induced by an electric field; and a system where at least a change in an absorption maximum of an electron absorption spectrum occurs according to a change in molecular structure induced by the electric field.

In addition, the present invention relates to a first functional molecular device, including: a molecule with permittivity anisotropy and/or a dipole moment; a metal ion; a conjugated molecule, the molecule with permittivity anisotropy and/or the dipole moment and the conjugated molecule forming a complex with the metal ion; an electric field applying means that applies an electric field to the molecule with permittivity anisotropy and/or the dipole moment; and an input/output means for the conjugated molecule, and also to a second functional molecular device including: a molecule whose π-conjugated system changes according to a change in molecular structure induced by an electric field; a molecule where at least a change in an absorption maximum of an electron absorption spectrum occurs according to a change in molecular structure induced by the electric field; an electric field applying means that applies an electric field to a system composed of the molecules; and an input/output means for the molecule whose π-conjugated system changes.

According to the first functional molecular element according to the present invention, a molecule with permittivity anisotropy and/or a dipole moment, a metal ion, and a conjugated molecule are included, with the molecule with permittivity anisotropy and/or the dipole moment and the conjugated molecule forming a complex with the metal ion, so that electrical properties or the like of the functional molecular element, such as conductivity, are achieved by the conjugated molecule, while on the other hand, a change in conformation for the complex forming part or the like corresponding to a change in electric field, for example, is achieved by the molecule with permittivity anisotropy and/or a dipole moment, so that the electrical properties or the like are modulated by changes in conformation for the complex forming part or the like.

Here, individual molecules, that is, the conjugated molecule and the molecule with permittivity anisotropy and/or a dipole moment, are in charge of the two functions of achieving electrical properties and the modulation of such using an electric field, so that optimal molecules for such purposes can be selected as the respective molecules. This means that it is possible to construct a high-performance functional molecular element that can control electrical characteristics with favorable response to an electric field.

According to the second functional molecular element according to the present invention, a functional molecular element is constructed using a system where a π-conjugated system changes according to a change in molecular structure induced by an electric field and a system where at least a change in an absorption maximum of an electron absorption spectrum occurs according to a change in molecular structure induced by an electric field, so that the electrical properties or the like of the functional molecular element, such as conductivity, are achieved by the π-conjugated system, and such properties are modulated by a change in molecular structure of the π-conjugated system induced by a change in electric field.

The mode of action of the electric field on the first and second functional molecular elements is such that the electron state of the functional molecular element is directly controlled and the functions thereof are modulated by the electric field. This mode of action is not exhibited by conventional functional molecular elements, such as field-effect transistors. Based on this new mode of action for an electric field, it is possible to construct a functional molecular element that can control electrical properties with favorable response to an electric field.

The first and second functional molecular devices according to the present invention include an electric field applying means that applies an electric field to the first and second functional molecular elements, respectively, and an input/output means, and an output corresponding to the electric field can be taken from the conjugated molecule and the system where a π-conjugated system changes according to a change in molecular structure induced by the electric field, respectively.

BRIEF DESCRIPTION OF DRAWINGS

FIG. 19A and FIG. 19B are infrared absorption spectra respectively before and after the application of a pre-processing high frequency electric field to a cell for measuring light absorption spectra with the same materials as the same field-effect molecular device 21B.

BEST MODE FOR CARRYING OUT THE INVENTION

Figure 1:
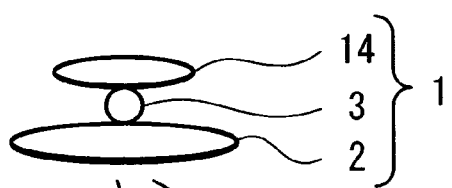
FIG. 1 is a series of schematic side views showing an example of two switching operation modes exhibited by a functional molecular element according to a first embodiment of the present invention.
Figure 1:
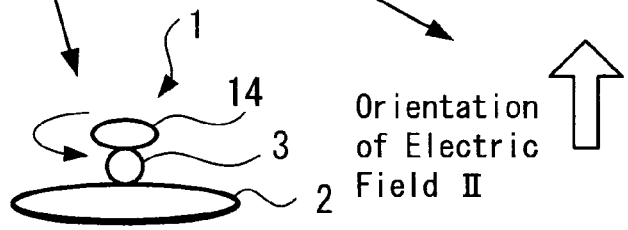
Figure 1:
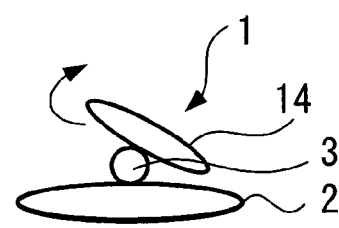

In a first functional molecular element according to the present invention, the above molecule with the permittivity anisotropy and/or dipole moment may be a Lewis base molecule and the above metal ion may be Lewis acid. Also, the orientation of the molecule with the permittivity anisotropy and/or dipole moment may change due to the action of an electric field, with the conductivity of the conjugated molecule changing as a result.

The conjugated molecule may be polypyrrole, the molecule with the above permittivity anisotropy and/or dipole moment may be 4-pentyl-4'-cyanobiphenyl, and the metal ion may be a silver ion.

In the first functional molecular element according to the present invention, the input/output means may input and output electrons. The molecule with the permittivity anisotropy and/or dipole moment may be oriented on an electrode for applying the electric field, the metal ion and the conjugated molecule may be disposed at least between the opposing electrodes, and the output corresponding to the electric field may be taken from at least one of the opposing electrodes.

Also, a conductive path may be formed by the conjugated molecule, for example, and by changing the electric field that acts upon the molecule with the permittivity anisotropy and/or dipole moment, the conductivity of the conductive path may be controlled. In this case, before the electric field is applied, a high frequency electric field used for preprocessing may be applied to the complex so that the conductivity of the conductive path is changed so as to have desired characteristics.

Also, by changing the electric field that acts upon the molecule with the permittivity anisotropy and/or dipole moment, the positional relationship of the molecule with respect to the orientation of the electric field may be changed and the angle between the molecule and the conjugated molecule (a valence angle via the metal ion), the acting position of the metal ion, or the three-dimensional structure of the complex may change.

Also, the layer of the conjugated molecule and the layer of the molecule with the permittivity anisotropy and/or dipole moment may form a layered structure.

In this case, it is possible to use a construction where an insulating layer is provided on the first electrode, a second electrode and a third electrode are formed on the insulating layer so as to not contact one another, the layered structure described above is disposed at least between the second electrode and the third electrode, and a fourth electrode is provided directly, or via an insulating layer, on a layer of the Lewis base molecule in the layered structure.

The second functional molecular element and the second functional molecular device according to the present invention may effectively be the same as the first functional molecular element and the first functional molecular device, respectively.

Next, preferred embodiments of the present invention will be described in detail with reference to the attached drawings.

First Embodiment: Functional Molecular Element

A switching operation can be considered as one example of the function of a molecular element 1 that realizes a function whereby the three-dimensional structure is changed by application of an electric field. FIG. 1 is a schematic side view showing a model of the changes that occur in the periphery of a metal ion 3 when an electric field is applied to the functional molecular element 1. In the functional molecular element 1 of this example, a Lewis base molecule 14 and a conductive key molecule 2, which includes a conjugated system, form a complex with a metal ion 3. In FIG. 1, for ease of explanation, the Lewis base molecule is a molecule with positive permittivity anisotropy or a molecule 14 with a dipole moment in a major axis direction of the molecule.

In response to the applied electric field, the molecule with positive permittivity anisotropy or molecule 14 with a dipole moment in a major axis direction of the molecule tries to reorientate itself so that its major axis direction matches the orientation of the electric field. It should be noted that when the Lewis base molecule is a molecule with negative permittivity anisotropy, the molecule tries to reorientate itself so that its minor axis direction matches the orientation of the electric field, so that a similar description to that given below will apply if the major axis direction and the minor axis direction are switched.

Regarding the dynamics of the switching operation exhibited by the molecule 14 when an electric field is applied, two operation modes can be conceived according to a difference in the direction of application of the electric field. This difference is shown in (b) and (c) of FIG. 1.

In an initial state shown in FIG. 1(a) where no voltage has been applied, the Lewis base molecule 14 of the functional molecular element 1 is aligned so that a major axis direction thereof is parallel to the axis direction (the left-right direction in the drawing) of the conductive key molecule 2 that has a conjugated system.

As shown in FIG. 1(b), when the electric field I is applied in a direction perpendicular to the plane of the drawing, the Lewis base molecule 14 tries to align its major axis with the orientation of the electric field I, and therefore attempts a 90° "neck-twisting" movement with the up-down direction in the drawing as the axis. Also, by applying the electric field in the left-right direction of the drawing, the orientation of the Lewis base molecule 14 can be forcibly restored to the original direction, that is, the left-right direction in the drawing.

On the other hand, as shown in FIG. 1(c), when an electric field II is applied in the up-down direction of the drawing, the Lewis base molecule 14 tries to align its major axis with the orientation of the electric field II, and therefore attempts a "see-saw" movement with the direction perpendicular to the plane of the drawing as the axis. When the application of the electric field is stopped, the movement is naturally relaxed and the orientation returns to the original orientation shown in FIG. 1(a).

The change in the structure and/or orientation of the Lewis base molecule 14 due to the application of an electric field as described above causes a change in the structure of the part forming a complex with the metal ion 3, and as a result, the bonding characteristics of the π complex forming part of the metal ion 3 and the conductive key molecule 2 and/or the molecular structure of the conductive key molecule 2 is/are changed, thereby causing a change in the conductivity of the conductive key molecule 2.

Figure 2A:
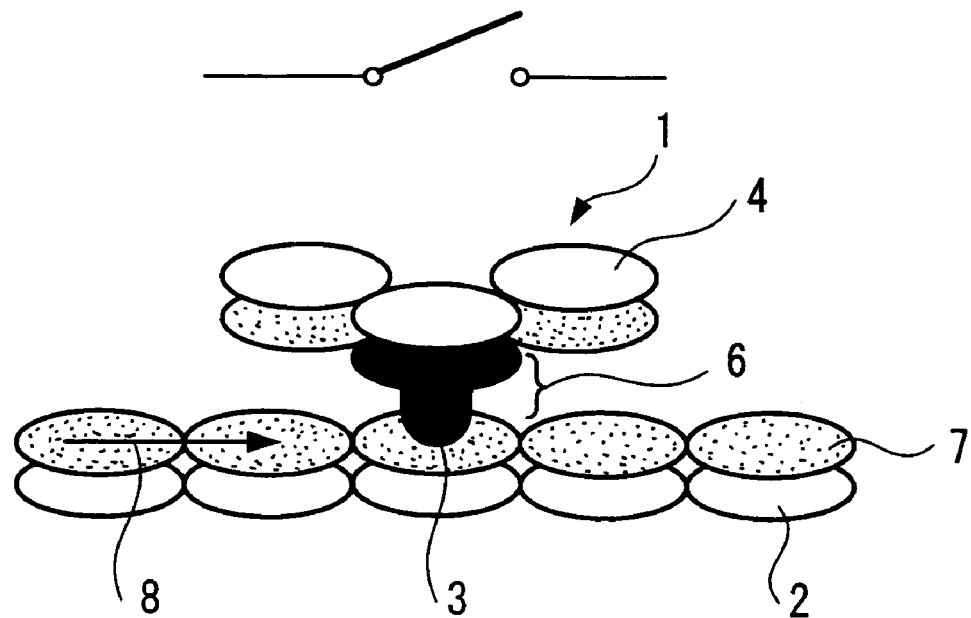
FIG. 2A and FIG. 2B are schematic perspective views conceptually showing, on a molecular level, one embodiment for realizing a switching function of the same functional molecular element.
Figure 2B:
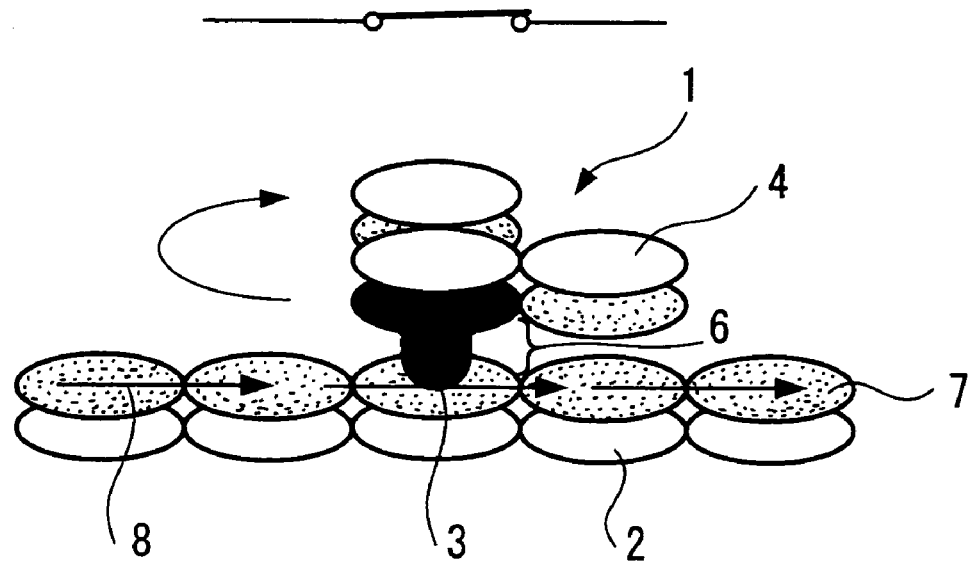

FIG. 2A and FIG. 2B are schematic perspective views conceptually showing, on a molecular level, a switching function of the functional molecular element 1 described above as one embodiment of the present invention. In the functional molecular element 1, a Lewis base molecule 4 that has permittivity anisotropy or a dipole moment is disposed in a "pendant-like" form, via the metal ion 3 that can act as a Lewis acid, with respect to a key molecule 2 in the form of a line or film that has a conjugated system and exhibits conductivity due to delocalized π electrons 7. The conductive key molecule 2 with a conjugated system and the Lewis base molecule 4 respectively form a complex with the metal ion 3.

Since the Lewis base molecule 4 that forms the pendant part has permittivity anisotropy or a dipole moment, the Lewis base molecule 4 has a tendency in an electric field to attempt to orientate itself in a specific direction with respect to the orientation of the electric field (more specifically, so that the major axis direction of the molecule matches or is perpendicular to the orientation of the electric field).

Accordingly, by changing the electric field that acts upon the Lewis base molecule 4, the position of the pendant part is changed with respect to the orientation of the electric field, and as a result, the angle between the Lewis base molecule 4 and the conductive key molecule 2, the position of the ligand to which the metal ion is combined, or the structure, such as the three-dimensional structure, of a complex forming part 6 changes. By doing so, the conductivity (electron flow 8) of the conductive key molecule 2 can be controlled.

For example, FIG. 2A shows the case where the positional relationship between the Lewis base molecule 4 and the conductive key molecule 2 is inappropriate. In this state, the electron flow 8 in the conductive key molecule 2 that occurs through the conjugated system is blocked in the complex forming part 6 and therefore cannot flow, so that the functional molecular element 1 is in an OFF state.

On the other hand, FIG. 2B shows the case where the orientation of the Lewis base molecule 4 has changed, so that the positional relationship between the Lewis base molecule 4 and the conductive key molecule 2 with the conjugated system is appropriate. In this state, the electron flow 8 in the conductive key molecule 2 that occurs through the conjugated system is not obstructed in the complex forming part 6 and can therefore flow, so that the functional molecular element 1 is in an ON state.

In this way, in the functional molecular element 1, the electric field does not directly act on the conductive key molecule 2 and modulate the conductivity thereof, but instead moves the Lewis base-molecule 4, and by doing so, the flow of electrons in the complex forming part 6 is modulated. If the flow of electrons through the conjugated system of the key molecule 2 is compared to the flow of water through a water pipe, the operation of an electric field on a conventional organic FET or the like changes the thickness of the water pipe. On the other hand, the operation of an electric field in the present embodiment can be compared to an operation that opens and closes a valve (which corresponds to the complex forming part 6) provided in the water pipe (which corresponds to the conductive key molecule 2) by operating a handle (which corresponds to the Lewis base molecule 4).

According to differences in the structure and the like of the complex forming part 6 and the pendant part, a variety of combinations are conceivable for the functional molecular element 1.

For example, the pendant part may be composed of a plurality of molecules with a conjugate property. Also, when the molecules composing the pendant part exhibit permittivity anisotropy, this may be positive permittivity anisotropy or negative permittivity anisotropy.

Second Embodiment: Field Effect Molecular Device

Here, a field-effect molecular device 21 and a fabrication process for the same will now be described, the field-effect molecular device 21 being assembled with polypyrrole 22 used as the conductive key molecule 2 that has a conjugated system and exhibits conductivity, a silver (I) ion 23 used as the metal ion 3, and 4-pentyl-4'-cyanobiphenyl (hereinafter abbreviated to "5CB") 24 used as the Lewis base molecule 14 that has a dipole moment in the major axis direction of the molecule.

The molecular structures of the 4-pentyl-4'-cyanobiphenyl 24 and pyrrole are as follows, with the polypyrrole 22 being a polymer where pyrrole molecules are polymerized in a chain:

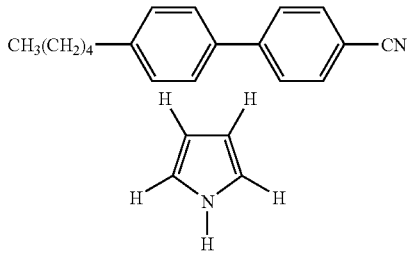

4-pentyl-4'-cyanobiphenyl pyrrole

Figure 3A:
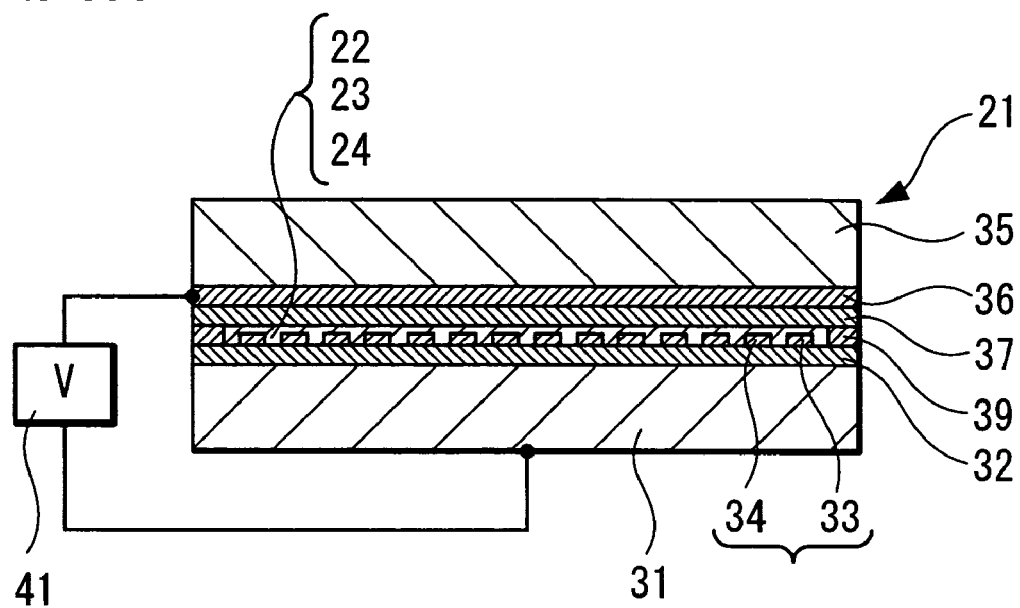
FIG. 3A is a schematic cross-sectional view showing a field-effect molecular device 21 according to a second embodiment of the present invention and FIG. 3B is a plan view of comb-shaped electrodes.
Figure 3B:
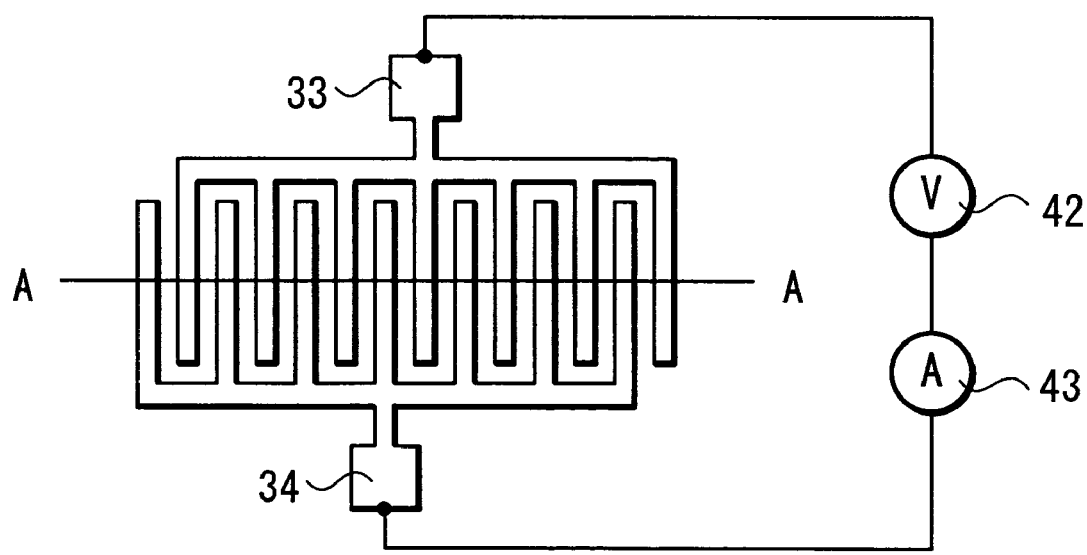

FIG. 3A and FIG. 3B are schematic diagrams showing the structure of the field-effect molecular device 21. FIG. 3B shows comb-shaped electrodes 33 and 34 used in the field-effect molecular device 21, and FIG. 3A is a schematic cross-sectional view where the field-effect molecular device 21 is cut along the line A-A shown in FIG. 3B.

In the field-effect molecular device 21, an insulating layer 32 is formed on a first substrate 31 that also serves as a control electric field applying electrode, with the comb-shaped electrodes 33 and 34 being formed thereupon to measure the conductivity of the polypyrrole 22. On the other hand, an ITO (Indium Tin Oxide) film 36, which is another control electric field applying electrode, is formed on a second substrate 35, with a homogeneously orienting film 37 being laminated thereupon. The polypyrrole 22, the silver (I) ion 23, and the 4-pentyl-4'-cyanobiphenyl 24 are sandwiched together with a spacer (omitted from the drawings) between the two substrates 31 and 35, with an end part thereof being sealed by a sealant 39. In reality, a layer of the polypyrrole 22 and a layer of the 4-pentyl-4'-cyanobiphenyl 24 may be laminated.

The first substrate 31 that also serves as a control electric field applying electrode and the ITO film 36 that serves as the other control electric field applying electrode are electrically connected to a control electric field applying power supply 41. The comb-shaped electrodes 33 and 34 are electrically connected to a power supply 42 for measuring conductivity and an ammeter 43.

Figure 4:
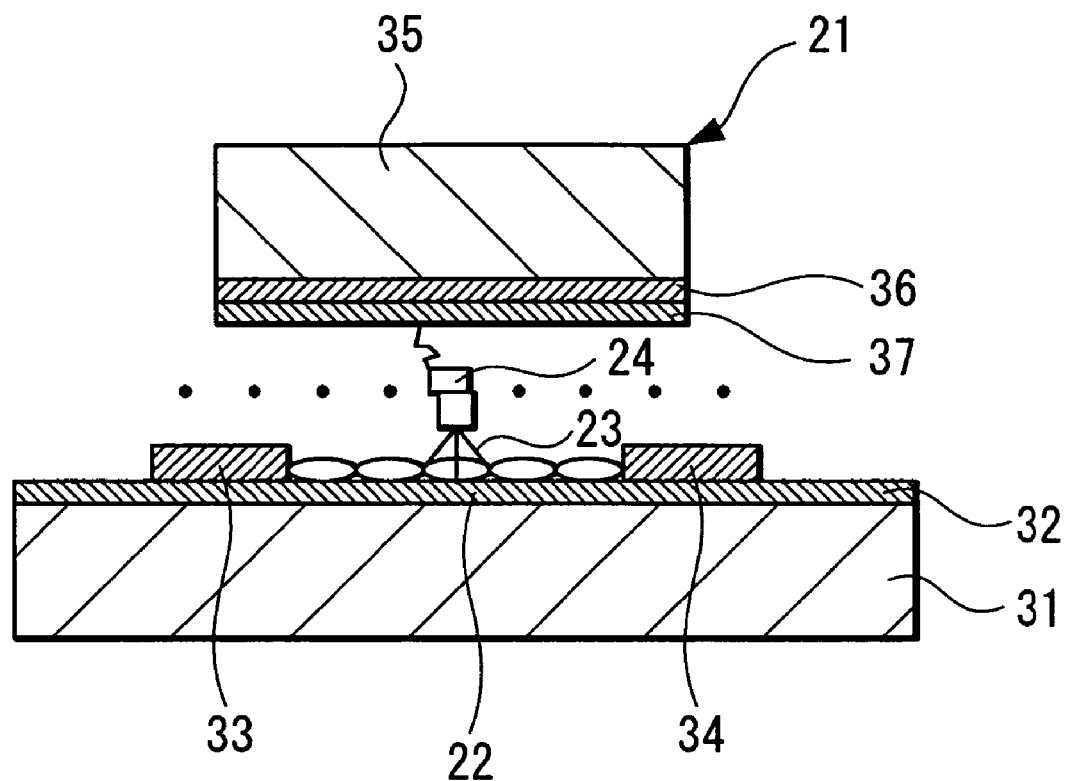
FIG. 4 is a schematic cross-sectional view (conceptual diagram) showing the same field-effect molecular device 21.

FIG. 4 is a schematic cross-sectional view for conceptually showing the structure of the field-effect molecular device 21 at a molecular level. In FIG. 4, the polypyrrole 22, the silver (I) ion 23, and the 4-pentyl-4'-cyanobiphenyl 24 are respectively shown as single units, but this is merely a representation and it should be obvious that a large number of the same chemicals types are included. Hereinafter, the fabrication process of the field-effect molecular device 21 will be described with reference to FIG. 4.

First, the first substrate 31 and the ITO film 36, which also serve as the control electric field applying electrodes for applying a control electric field to the 4-pentyl-4'-cyanobiphenyl 24, and the comb-shaped electrodes 33 and 34, for measuring the conductivity of the polypyrrole 22, are fabricated.

As one example, a silicon substrate that has been doped with a high concentration is used as the first substrate 31 that also serves as a control electric field applying electrode. By thermally oxidizing the surface of the first substrate 31, a silicon oxide film is formed as the insulating layer 32. The comb-shaped electrodes 33 and 34, which are metal electrodes or the like, are formed on the insulating layer 32 by sputtering or the like.

On the other hand, a glass substrate, for example, is used as the second substrate 35, and the ITO film 36 is formed by vacuum deposition or the like on the surface of the second substrate 35 and is set as the other control electric field applying electrode.

In addition, the homogeneously orienting film 37 of polyvinyl alcohol or the like is formed by coating or other method on the ITO film 36. The homogeneously orienting film 37 serves a role of orienting the 4-pentyl-4'-cyanobiphenyl 24 in the surface direction and also as the insulating layer. The homogeneously orienting film 37 is heat treated and then subjected to a rubbing process.

Next, the materials of the functional molecular element are assembled between the electrodes described above, thereby fabricating the principal part of the field-effect molecular device 21 that can measure modulation of conductivity.

After the polypyrrole 22 has been fabricated by electric field polymerization, the polypyrrole 22 is separated from the electric field polymerization electrodes, stuck onto the comb-shaped electrodes 33 and 34 formed on the insulating layer 32 of the first substrate 31, and dried to improve the adhesion to the electrodes. After this, a 4-pentyl-4'-cyanobiphenyl-silver (I) complex that has been synthesized in advance is applied onto the polypyrrole 22.

The first substrate 31 and the second substrate 35 are then stuck together so that the homogeneously orienting film 37 formed on the second substrate 35 tightly adheres to the 4-pentyl-4'-cyanobiphenyl-silver (I) complex layer.

By sticking the substrates together, the 4-pentyl-4'-cyanobiphenyl 24 connected to the homogeneously orienting film 37 is homogeneously aligned in the rubbing direction. At this time, since some of the amino groups —NH included in the polypyrrole 22 form a hydrogen bond with the cyano groups —CN of the 4-pentyl-4'-cyanobiphenyl, the polypyrrole 22 is also aligned in the rubbing direction. The aligned polypyrrole 22 differs to random-coil-shaped polypyrrole film, and can exhibit high conductivity. As a result, as described later, when the application of the electric field is turned on and off, the conductivity of the polypyrrole 22 can be greatly modulated. However, the hydrogen bonds described above do not directly affect the $\pi$-conjugated system of the polypyrrole.

It should be noted that most of cyano groups —CN of the 4-pentyl-4'-cyanobiphenyl (5CB) 24 are bonded by dipole-dipole interaction between the cyano groups to form dimers of 5CB 24. Also, some of the cyano groups —CN are coordinated to the silver (I) ions, or are hydrogen bonded to the amino groups —NH of the surrounding polypyrrole. Since the coordinate bonds between the silver (I) ions and cyano groups are strong, such bonds are not broken when the orientation of the 5CB 24 changes due to the application of an electric field. On the other hand, since the hydrogen bonds between the cyano groups and the amino groups are weak, such bonds are broken when the orientation of the 5CB 24 changes.

Finally, the end parts of the two substrates 31 and 35 that have been stuck together are sealed by the sealant 39, such as epoxy resin, thereby completing the field-effect molecular device 21.

When a voltage applied to the first substrate 31 and the ITO film 36 that also serve as the control electric field applying electrodes of the field-effect molecular device 21 fabricated as described above is turned on and off and the conductivity of the polypyrrole 22 between the comb-shaped electrodes 33 and 34 is measured, a high resistance is exhibited when the electric field is off, but a modulating effect whereby the resistance falls when the electric field is applied is observed.

In an initial orientation before application, the alignment is homogeneous, and the 5CB 24 is orientated in parallel with the alignment film 37. The 5CB 24 is molecules that have a dipole moment due to the cyano groups in the major axis direction of the molecules, and since an electric field is applied to the field-effect molecular device 21 shown in FIGS. 3A and 3B and FIG. 4 in the up-down direction in the drawings, the mode of operation of the pendant part is the "see-saw" operation shown earlier in FIG. 1($c$). The state of the 5CB 24 shown in FIG. 4 shows an erected state due to the application of the driving voltage.

Modulation of the conductivity due to the application of an electric field is observed for the following reason. Before application of the electric field, silver (I) ions and pyrrole ring $\pi$ electrons form n complexes. By changing the orientation of the 5CB 24 by applying the electric field, the positions of the 5CB 24 with respect to the pyrrole rings change, the 5CB-silver (I) complex forming parts move outside the pyrrole ring surfaces (the $\pi$-conjugated systems), and the silver (I) ions and the pyrrole rings form $\pi$ complexes. As a result, the torsional energy of the dihedral angle between the pyrrole rings is reduced, thereby improving the conductivity.

The 4-pentyl-4'-cyanobiphenyl (5CB) molecules used exhibit liquid-crystal characteristics, but since liquid-crystal characteristics are not required for the switching (liquid-crystal characteristics do not appear in single molecules), it is naturally possible to use such molecules as elements on a molecular level.

In this way, the present embodiment proposes a new functional molecular element where a molecule with permittivity anisotropy or a dipole moment is disposed in a pendant shape via a metal ion on conductive key molecules in the form of a line or film, the orientation of the pendant part is changed by the application of an electric field with respect to the orientation of the electric field, and the structure of the complex molecules is thereby modulated, and as a result the conductivity (the flow of electrons) of the conductive key molecules is controlled.

In the same way as turning a faucet of a water pipe to control the flow of the water inside the water pipe, by changing the orientation of the molecules of the pendant part in the functional molecular element described above, the flow of electrons inside the conductive key molecules 2 is controlled. Unlike conventionally proposed molecular elements where molecules themselves are thought of as single elements and the electron state of a molecule is changed to cause a change in conductivity, a molecular element is realized from a completely new viewpoint.

Normally, organic materials that exhibit conductivity include a $\pi$-conjugated system. If a $\pi$-electron is present, it will definitely be possible to form a $\pi$-complex, so that the principle described above can be applied to all organic molecules that exhibit conductivity. That is, aside from the polypyrrole described above, conductive polymers such as polyparaphenylene, polynaphthalene, polyanthracene, polypyrene, polyazulene, polyfuran, polythiophene, polyselenophene, poly(para phenylenesulfide), poly(para phenylene oxide) and polyaniline can be used. In addition, there are cases where an oligomer where the degree of polymerization of the above polymers is 20 or below or even a monomer may be used. In addition, carbon molecules, such as carbon nanotubes, that have a $\pi$-electron conjugated system may be used.

Also, as the Lewis base molecules that respond to the electric field, aside from the 4-pentyl-4'-cyanobiphenyl described above, pyrimidine liquid crystal molecules, pyridine liquid crystal molecules, and cyano liquid crystal molecules, each of which include nitrogen atoms, and liquid crystal molecules that include phosphorus atoms can be given as examples.

Also, as the metal ions forming the complex, aside from the silver (I) ions described above, ions of transition metals such as vanadium, chromium, manganese, iron, cobalt, copper, zinc, ruthenium, rubidium, cadmium, and mercury can be given as examples.

Also, the molecular elements can be applied to various fields of electronic devices, such as switches, transistors, memories, and logic circuits.

In addition to the ability to select an appropriate material from the vast number of types of molecules and the ability to construct everything from elements of a normal size to elements of a nanometer size using molecules of the same materials, the advantages of the functional molecular element composed of organic molecules and the like according to the present invention can be indicated as follows.

1. Low Power Consumption

The units for operations are one molecule and one electron, so that elements operate with fundamentally low power consumption and there is little heat generation, so that problems due to heat generation do not occur even with high density integration.

2. Any Driving Frequency can be Used

As observed with the improvements in high-speed response of modern liquid crystals, by adjusting the materials and structure, a high-speed response at least equal to that of inorganic semiconductor crystals can be expected.

3. Low Pollution

The normal synthesis of organic compounds does not require reagents that are harmful to humans or the environment, such as those used in the manufacturing process of inorganic semiconductors.

4. High Versatility

Functions such as a taste sensor or odor sensor that could not conventionally be realized can be realized by making use of the characteristics of various organic molecules.

Specific Embodiments

Next, examples where the field-effect molecular device 21 shown in FIGS. 3A and 3B and FIG. 4 has been fabricated as favorable specific embodiments of the present invention will be described in detail.

Specific Embodiment 1

First, the first substrate 31 and the ITO film 36, which also serve as control electric field applying electrodes for applying a controlling electric field to the 4-pentyl-4'-cyanobiphenyl 24, and the comb-shaped electrodes 33 and 34, which are conductivity measuring electrodes for measuring the conductivity of the polypyrrole 22, were fabricated.

A silicon substrate that has been doped with a high concentration was used as the first substrate (a control electric field applying electrode) 31. The insulating layer 32 was formed by carrying out a heat treatment to form a silicon oxide thin film on the surface of the first substrate 31. The comb-shaped electrodes 33 and 34 were formed of metal as electrodes for measuring the conductivity of the polypyrrole 22 on the insulating layer 32 by sputtering.

Next, after the ITO film 36 has been formed by vapor deposition on the second substrate (a glass substrate) 35 as the other control electric field applying electrode, the homogeneously orienting film (that also serves as an insulating layer) 37 was formed on the ITO film 36. Polyvinyl alcohol was selected as the material of the orienting film, and a 10% by mass aqueous solution of polyvinyl alcohol was prepared and applied on the ITO film 36 by spin coating, and a heat treatment was carried out for thirty minutes at 110° C.

After the heat treatment, the polyvinyl alcohol was subjected to a rubbing process, spacers with a 3 μm diameter were sprinkled, and drying was carried out for three days and nights.

ITO electrodes were formed on a glass substrate used to fabricate the polypyrrole 22, and reduced polypyrrole 22 was fabricated by an electric field polymerization method (such fabrication was achieved by constant current anodizing where the conditions were such that polymerization was carried out at 1.0 mA/cm$^2$, 50 mC/cm$^2$ and then reduction was carried out at −0.5 mA/cm$^2$, 16 mC/cm$^2$). The resulting film was detached and was stuck onto the comb-shaped electrodes 33 and 34 of the first substrate. The first substrate and the second substrate were stuck together via a spacer, with the gap between the substrates being set at 40 μm.

An aqueous solution of silver nitrate and 4-pentyl-4'-cyanobiphenyl were mixed and caused to react for three hours at 140° C. The obtained 4-pentyl-4'-cyanobiphenyl—silver (I) complex solution was introduced between the first substrate 31 and the second substrate 35 using a capillary phenomenon. When a complex of polypyrrole and silver (I) ions and 4-pentyl-4'-cyanobiphenyl is formed, the color of the membrane prominently changes (a change from yellow to dark blue), and since this change of color was observed, it was confirmed that such complex was formed.

Finally, end parts of the two substrates 31 and 35 that have been stuck together were sealed by the sealant 39 such as epoxy resin, thereby completing the field-effect molecular device 21.

In this way, when the voltage applied between the first substrate 31 and the ITO film 36 that also serve as control electric field applying electrodes of the field-effect molecular device 21 fabricated as described above was turned on and off and the conductivity of the polypyrrole 22 between the comb-shaped electrodes 33 and 34 was measured under a DC bias voltage, a high resistance is exhibited when the electric field is off but a modulating effect was observed whereby the resistance falls when the electric field is applied.

Figure 5:
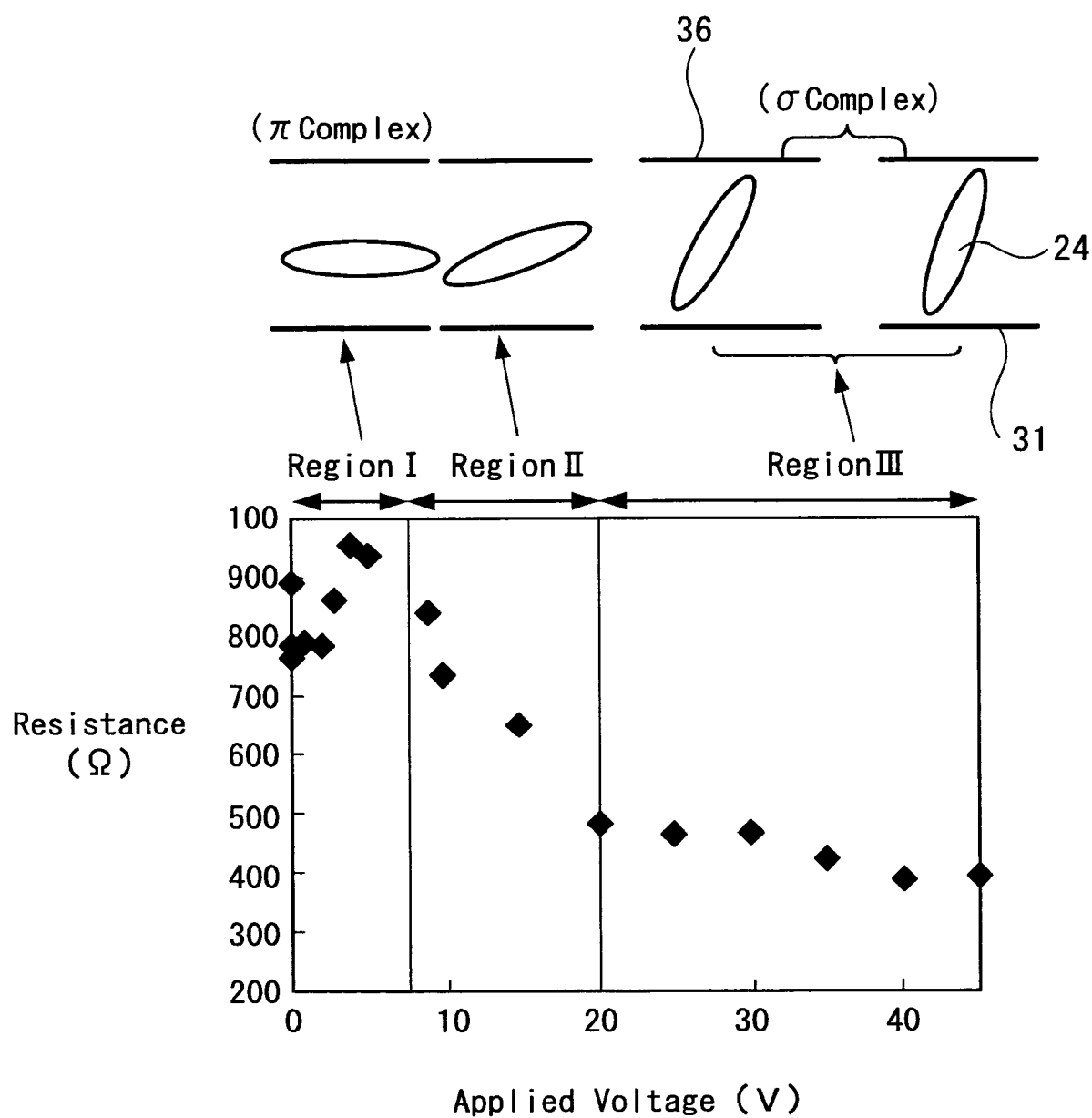
FIG. 5 is a graph showing the relationship between the conductivity and the applied voltage in the field-effect molecular device 21 according to specific embodiment 1 of the present invention.

FIG. 5 is a graph showing the result of measuring the resistance between the comb-shaped electrodes 33 and 34 relative to the magnitude of the applied voltage when a high frequency electric field of 10 kHz with a bipolar rectangular waveform was applied between the first substrate 31 and the ITO film 36 that also serve as the control electric field applying electrodes of the field-effect molecular device 21. In view of the applied voltage, the entire range can be classified into three regions. Representations of the orientations of the pendant parts composed of the 5CB 24 between the first substrate 31 and the ITO film 36 corresponding to the respective regions have been appended in the upper part of FIG. 5.

In the region I where the applied voltage is below 7 to 8V, the resistance hardly changes or slightly increases as the applied voltage increases. The cause of such increase is not clear, but it is thought that in the region I, the action of the electric field is insufficient due to the applied voltage being too small, so that as shown in the appended representation, the orientation of the pendant unit hardly changes from the initial state, and as a result, the change in the resistance is also small.

In the region II where the applied voltage is 9 to 20V, as the applied voltage increases, the resistance decreases sharply. It is thought that in the region II, the applied voltage is sufficiently large and since the orientation of the pendant unit is determined in accordance with the magnitude of the applied voltage, the resistance is prominently affected by the applied voltage.

In the region III where the applied voltage exceeds 20V, there is little change in the resistance due to the increase in the applied voltage. It is thought that the change in orientation of the pendant part is maximized, so that in the region III the change in the orientation of the pendant part becomes small as shown in the appended representation, and as a result, the change in the resistance also becomes small.

Figure 6:
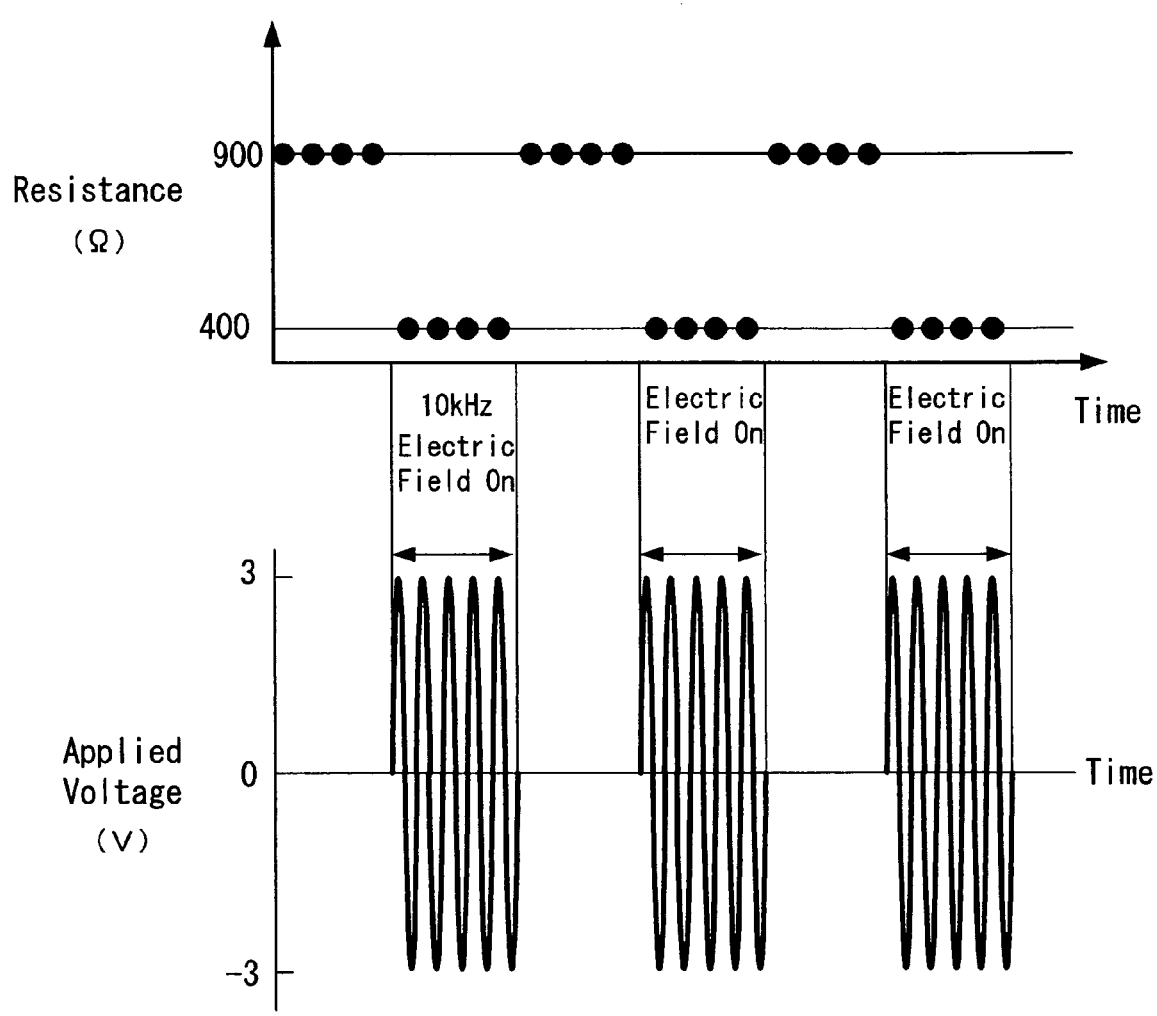
FIG. 6 is a graph showing how the conductivity of the same field-effect molecular device 21 can be modulated by the application of an electric field.

FIG. 6 is a graph showing the result of measuring the resistance between the comb-shaped electrodes 33 and 34 relative to time when a high frequency electric field of 10 kHz and 1 V/μm with a bipolar sine waveform was intermittently applied between the first substrate 31 and the ITO film 36 that also serve as control electric field applying electrodes of the field-effect molecular device 21. It can be seen that the conductivity is effectively modulated by the electric field being turned on and off.

COMPARATIVE EXAMPLE 1

The 4-pentyl-4'-cyanobiphenyl-silver (I) complex introduced between the substrates in specific embodiment 1 was replaced with only 4-pentyl-4'-cyanobiphenyl with the other parts being the same as the specific embodiment 1, thereby fabricating a dummy field effect molecular device that does not include silver (I) ions, and the conductivity of this structure was measured (at this time, the color of the reduced polypyrrole film remained yellow). No changes in conductivity due to the application of the electric field were observed. This is thought to be due to the effect of the electric field on the 4-pentyl-4'-cyanobiphenyl 24 not causing a change in the conductivity of the polypyrrole 22 due to the lack of silver (I) ions 23 and no links being formed between the 4-pentyl-4'-cyanobiphenyl 24 and the polypyrrole 22.

Specific Embodiment 2

To clearly show the mode of action of the effect of applying an electric field based on an absorption spectrum of visible and UV light, calcium fluoride substrates were used as the first substrate 31 and the second substrate 35, transparent electrodes composed of transparent conductive films were provided on the substrates as the control electric field applying electrodes, and the comb-shaped electrodes 33 and 34 were not provided, but aside from this, a cell for measuring the absorption spectrum of visible and UV light with the same materials as the field-effect molecular device 21 was fabricated in the same way as the specific embodiment 1.

When a 4-pentyl-4'-cyanobiphenyl-silver (I) complex solution is introduced using the capillary phenomenon between the first substrate 31 and the second substrate 35 where polypyrrole films have been stuck onto transparent conductive films, complexes were formed between the polypyrrole and the silver (I) ions and the 4-pentyl-4'-cyanobiphenyl, and a prominent change (a change from yellow to dark blue) was observed in the color of the films, thereby confirming that such complexes were formed.

Figure 7:
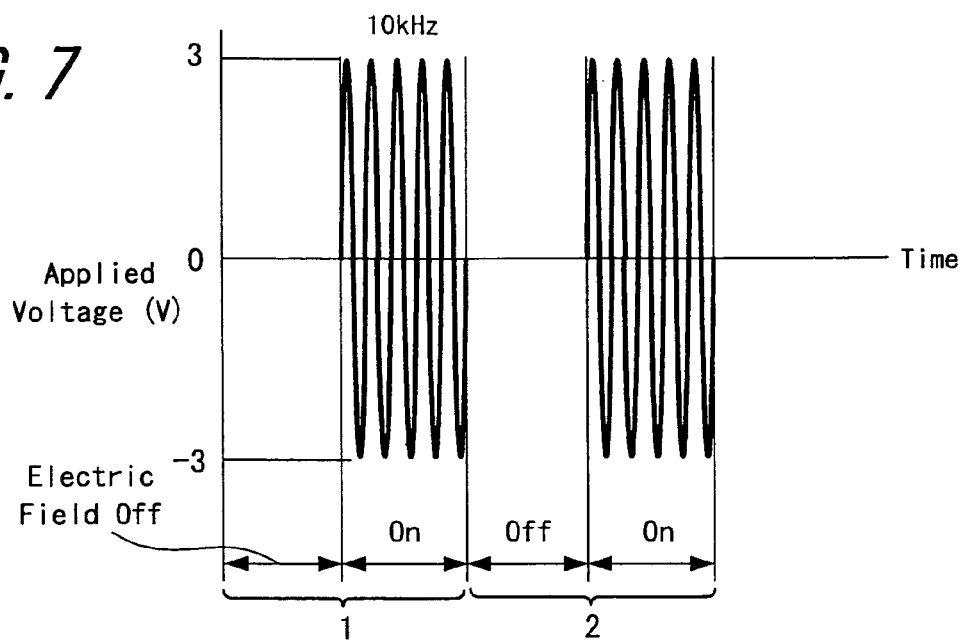
FIG. 7 is the absorption spectrum of visible and UV light for a cell that measures an absorption spectrum including the same materials as the field-effect molecular device 21 according to specific embodiment 2 of the present invention.
Figure 7:
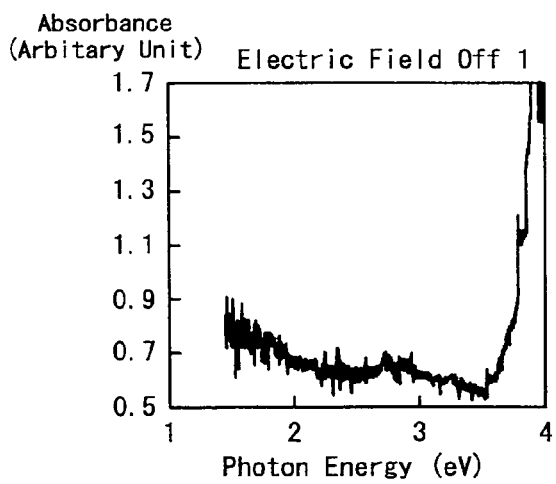
Figure 7:
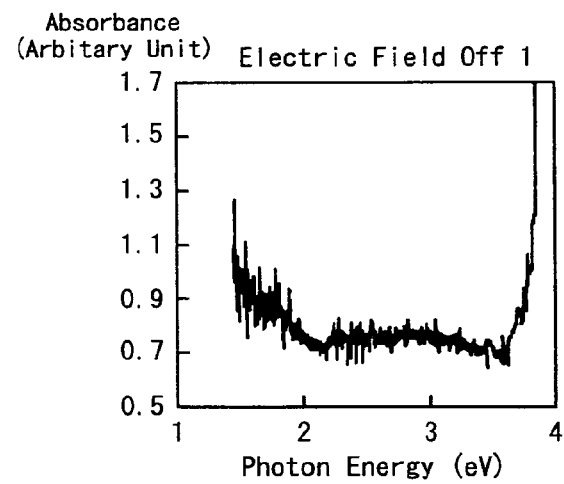
Figure 7:
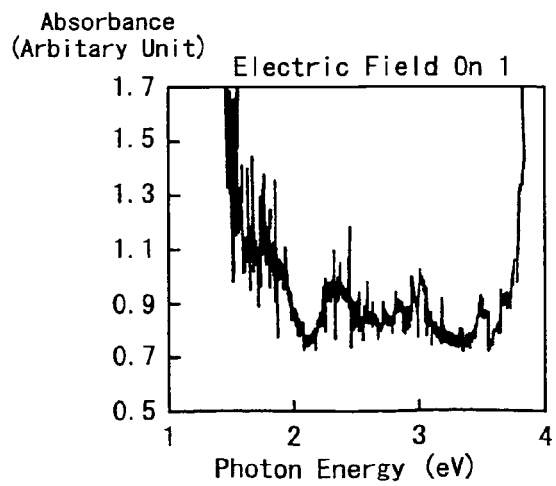
Figure 7:
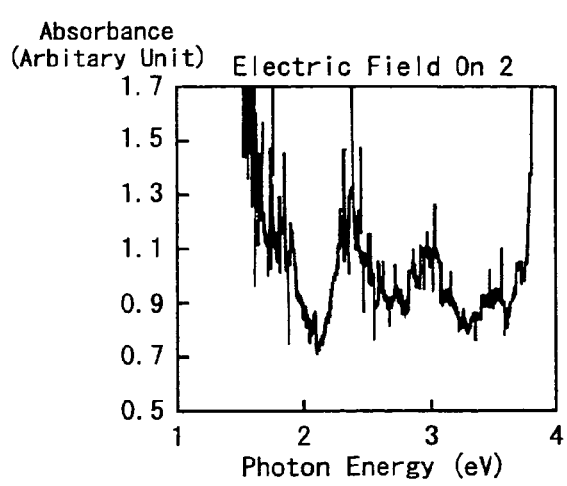

When a high frequency electric field of 10 kHz and 1 V/µm with a bipolar sine waveform was intermittently applied between the control electric field applying electrodes of the cell for measuring the absorption spectrum of visible and UV light, and the absorption spectrum of visible and UV light was measured, a shift in the absorption maximum due to the turning on and off of the electric field was observed as shown in FIG. 7.

COMPARATIVE EXAMPLE 2

The 4-pentyl-4'-cyanobiphenyl-silver (I) complex introduced between the substrates in specific embodiment 2 was replaced with only 4-pentyl-4'-cyanobiphenyl, thereby fabricating a dummy cell for measuring the absorption spectrum that does not include silver (I) ions but is otherwise the same as specific embodiment 2. In the same way as specific embodiment 2, a high frequency electric field of 10 kHz with a bipolar sine waveform was intermittently applied between the control electric field applying electrodes of the dummy cell, and the absorption spectrum of visible and UV light of the dummy cell was measured, thereby obtaining the results shown in FIG. 8.

Figure 8:
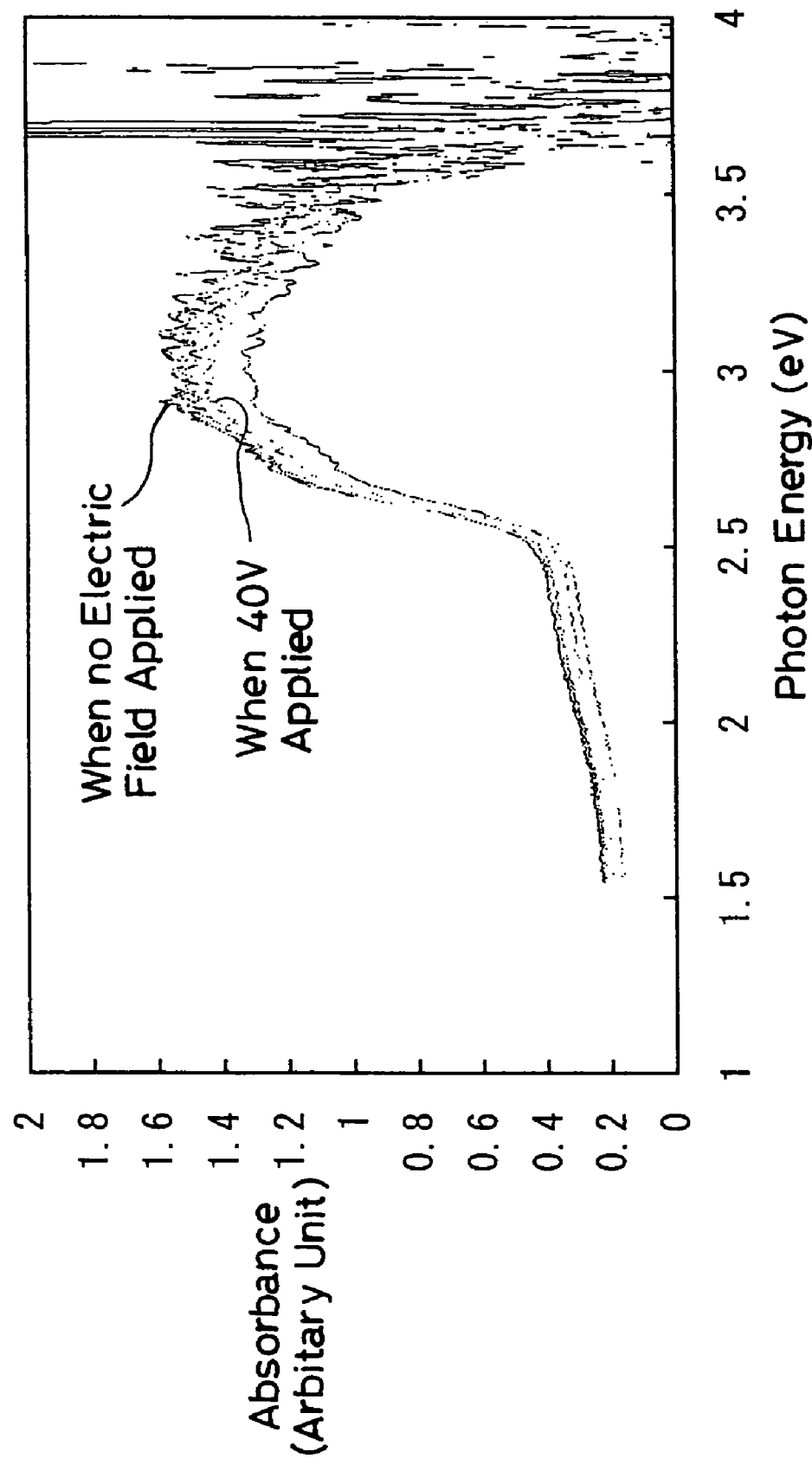
FIG. 8 is an absorption spectrum of visible and UV light for a dummy cell that measures an absorption spectrum according to comparative example 2 for the present invention.

In FIG. 8, the spectra measured when a variety of applied voltages from 0V to 40V are applied are shown on top of one another, but no phenomenon whereby the wavelength of the absorption maximum in the absorption spectrum shifts due to the application or non-application of voltage was observed. This is thought to be due to the effect of the electric field on the 4-pentyl-4'-cyanobiphenyl 24 not causing a change in the conductivity of the polypyrrole 22 due to the lack of silver (I) ions 23 and no links being formed between the 4-pentyl-4'-cyanobiphenyl 24 and the polypyrrole 22.

Specific Embodiment 3

When an electric field $V_g$, which is applied between the first substrate 31 and the ITO film 36 that also serve as the control electric field applying electrodes of the field-effect molecular device 21 fabricated in the same way as specific embodiment 1, is gradually increased from zero, and a current density $I_{ds}$ flowing through the polypyrrole 22 between the comb-shaped electrodes 33 and 34 is measured under an AC bias voltage, the current density $I_{ds}$ when the electric field $V_g$ is off is small, but a modulating effect whereby the current density $I_{ds}$ gradually increases in accordance with the increase in the applied voltage $V_g$ was observed. Also, although the current density $I_{ds}$ decreases as the applied electric field $V_g$ is gradually reduced, hysteresis was also observed. That is, with respect to an applied electric field $V_g$ of the same size, the current density $I_{ds}$ measured when the applied electric field $V_g$ was decreasing was large compared to the current density Ids measured when the electric field $V_g$ was increasing.

Figure 9:
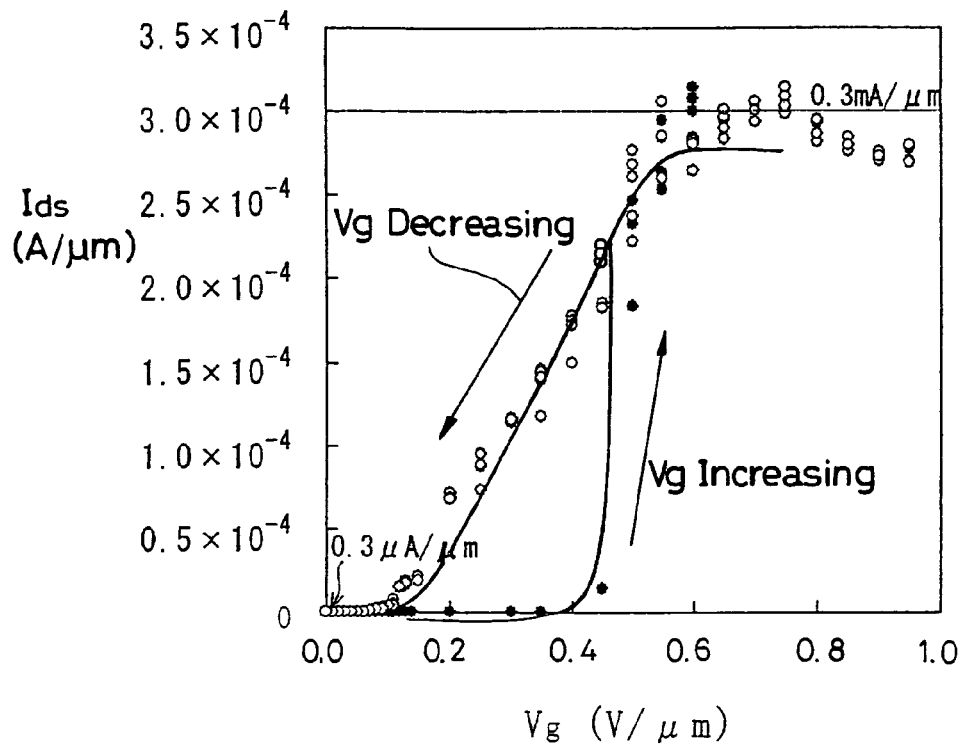
FIG. 9 is a graph showing the relationship between the current density flowing between the comb-shaped electrodes and the strength of the applied electric field in the field-effect molecular device 21 according to specific embodiment 3 of the present invention.

FIG. 9 is a graph showing the relationship between the strength of the electric field $V_g$ and the current density $I_{ds}$ when a high frequency electric field of 10 kHz with a bipolar rectangular waveform has been applied between the first substrate 31 and the ITO film 36 that also serve as the control electric field applying electrodes of the field-effect molecular device 21. As shown in FIG. 9, hysteresis is exhibited so that in a case where as the applied electric field $V_g$ is increased, $I_{ds}$ finally starts to exhibit a significant magnitude around when $V_g$ exceeds 0.4 (v/cm), while when the applied electric field $V_g$ is reduced after $I_{ds}$ has reached a maximum (around 0.3 mA/µm), even when $V_g$ has fallen to 0.4 (v/cm), Ids still maintains at least 60% or so of the maximum, and when $V_g$ falls to around 0.1(v/cm), Ids finally returns to zero of thereabouts.

Calcium fluoride substrates were used as the first substrate 31 and the second substrate 35 to clearly show the mode; of action of the effect of applying an electric field based on measurements of an absorption spectrum of infrared light, transparent electrodes composed of transparent conductive films are provided on the substrates as the control electric field applying electrodes, and the comb-shaped electrodes 33 and 34 were not provided, but aside from this, a cell for measuring the absorption spectrum of infrared light with the same materials as the field-effect molecular device 21 was fabricated in the same way as specific embodiment 1.

Figure 10:
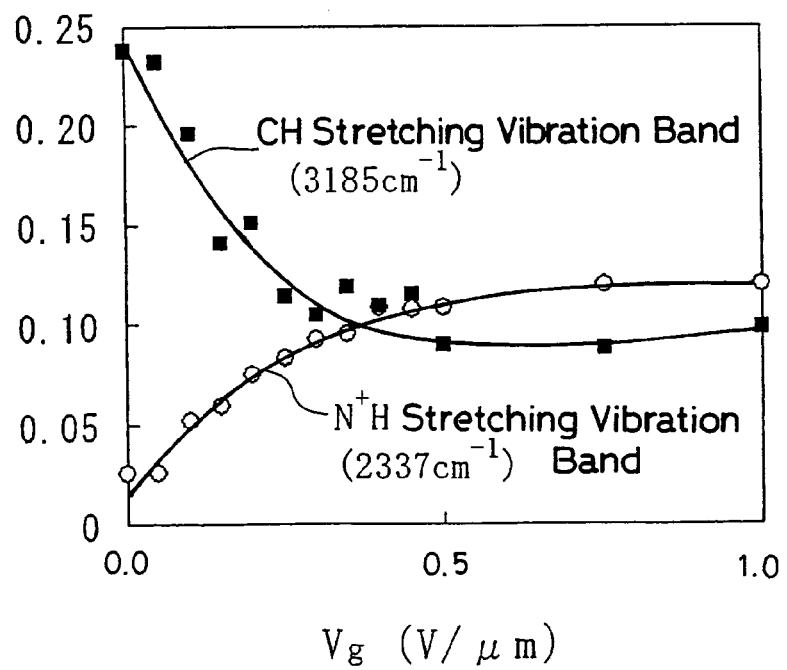
FIG. 10 is a graph showing the relationship between the infrared absorption intensity and the strength of the applied electric field in a cell for measuring an absorption spectrum that includes the same materials as the same field-effect molecular device 21.

In the same way as specific embodiment 2, when a high-frequency electric field of 10 kHz with a bipolar rectangular waveform was applied between the electrodes for applying the control electric field to the cell for measuring an infrared absorption spectrum, the electric field was gradually increased from zero, and the infrared absorption spectrum at that time was observed, changes in the N⁺H stretching vibration band (2337 $cm^{-1}$), which proves that σ complexes have been formed between the polypyrrole and silver (I) ions, and CH stretching vibration band (3185 $cm^{-1}$), which proves that π complexes were formed, were observed. That is, as shown in FIG. 10, as the control electric field increased, the strength of the CH stretching vibration band that shows that π complexes are formed became smaller and the strength of the N⁺H stretching vibration band that shows that σ complexes are formed became larger.

From this evidence, the cause of the observed increase in the current density $I_{ds}$ flowing through the polypyrrole 22 as the voltage $V_g$ applied to the field-effect molecular device 21 increases is thought to be a transition from a state where π complexes are predominant to a state where σ complexes are predominant, and it is supposed that the state where the σ complexes are formed improves the conductivity of the polypyrrole 22 compared to the state where the π complexes are formed.

Figure 11A:
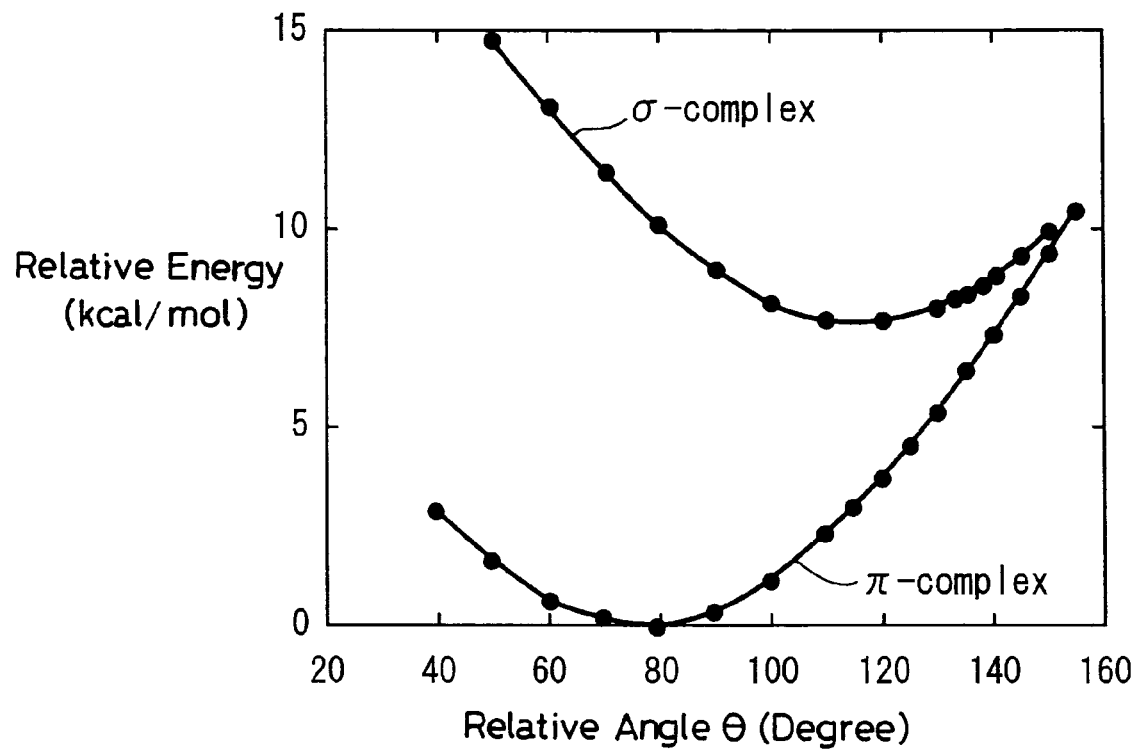
FIG. 11A and FIG. 11B are graphs showing the relationship between the energy (theoretical calculated values) of the σ complex and the π complex and a relative angle θ between the pyrrole ring and the 5CB pendant part in the same field-effect molecular device 21.
Figure 11B:
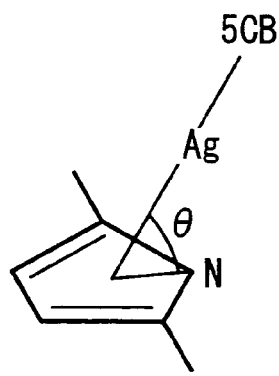

FIG. 11A shows the result of theoretically calculating the energy of complexes showing the structural stability of a σ complex and a π complex while the relative angle θ between the 5CB pendant part and the pyrrole ring shown in FIG. 11B changes. According to these calculations, it can be understood that both the π complex and the σ complex can exist in a stable state and that when a relative angle θ is set between the pendant part and the pyrrole ring so that the lowest energy is realized in the respective complexes, the π complex is around 10 kcal/mol more stable than the σ complex. Accordingly, it is thought that when an electric field is not applied, the π complex is more predominant than the σ complex.

However, it was also understood that when the relative angle θ between the pendant part and the pyrrole ring is large, the difference in energy between the π complex and the σ complex becomes gradually smaller, and when the angle θ is in excess of 150°, the energy in the π complex and the σ complex becomes substantially equal. This means that when a large relative angle θ is caused by an external force, a transition from the π complex to the σ complex can be induced.

Figure 12:
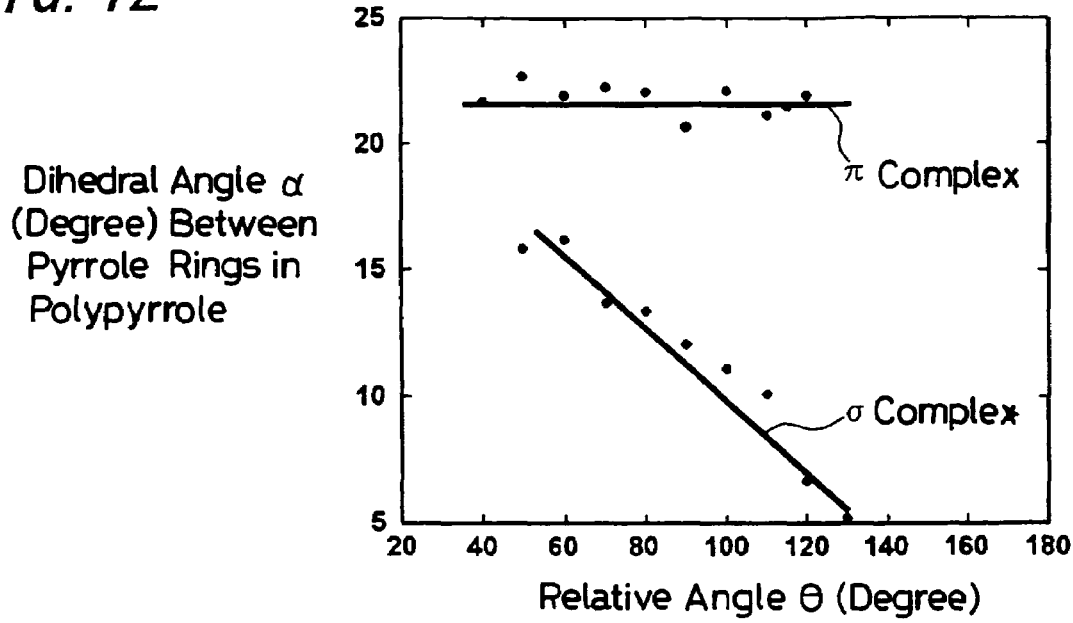
FIG. 12 is a graph showing the relationship between the dihedral angle α between the pyrrole rings of the σ complex and π complex and the relative angle θ in the same field-effect molecular device 21.

FIG. 12 shows, for an σ complex and a π complex, the result of theoretically calculating the relationship between a dihedral angle α between the pyrrole rings (the angle between a plane of the pyrrole ring that forms a complex and an adjacent pyrrole ring) and a relative angle θ made between the pendant part and the pyrrole ring. According to this calculation, for the π complex, the dihedral angle θ between the pyrrole rings hardly depends on the relative angle α and always exceeds 20°. In this way, when the dihedral angle α between the pyrrole rings is large, the conjugated relationship between the pyrrole rings is lost, so that the conductivity through the conjugated systems is lost and a high resistance is achieved.

Figure 13A:
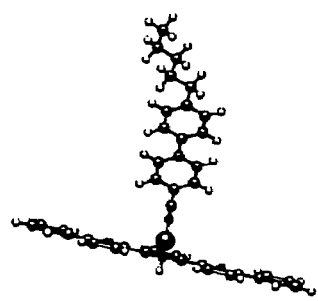
FIG. 13A and FIG. 13B are molecular models showing a low resistance state and a high resistance state of the σ complex of the same field-effect molecular device 21.
Figure 13B:
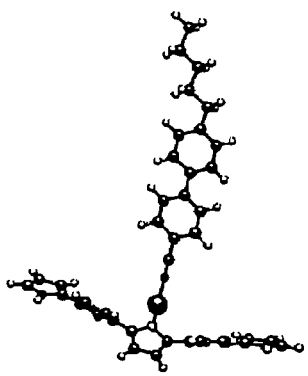

On the other hand, for the σ complex, the torsional energy and the dihedral angle α between the pyrrole rings significantly change in accordance with the relative angle θ. FIG. 13A and FIG. 13B are molecular models showing a low resistance state and a high resistance state for the σ complex. As shown in FIG. 13A, when the θ is 130°, for example, the dihedral angle α is 5° from FIG. 12, so that the orientations of the pyrrole rings become substantially equal. This means that the conjugated relationship between the pyrrole rings is not lost and the conductivity through the conjugated systems is favorable, resulting in low resistance. On the other hand, as shown in FIG. 15(b), when the angle θ is 50°, for example, the dihedral angle α is 17° from FIG. 12, so that the difference in orientation between the pyrrole rings is large, the conjugated relationship between the pyrrole rings is lost, and the conductivity through the conjugated systems is lost, resulting in high resistance.

To collate the results of the theoretical calculations given above, it was understood that in a normal state where no electric field is applied, π complexes that have high electric resistance are predominant, but when a large relative angle θ is caused by an external force, not only can a transition from the π complexes to the σ complexes be induced, but also for such σ complexes, the dihedral angle between the pyrrole rings is low so that the conductivity through the conjugated systems is favorable, thereby achieving a low resistance state.

The results of the theoretical calculations given above match the inferences made from measurements of the infrared absorption spectrum, and by combining such results, it can be concluded that the increase in the observed current density $I_{ds}$ that flows through the polypyrrole 22 when the electric field $V_g$ applied to the field-effect molecular device 21 has increased changes the orientation of the 4-pentyl-4'-cyanobiphenyl (5CB) molecule due to the increase applied voltage $V_g$, and the resulting increase in the relative angle θ between the pendant part and the pyrrole ring induces a transition from the π complex to the σ complex and a reduction in the dihedral angle α, so that the conductivity of the pyrrole chain is modulated from a high resistance state to a low resistance state.

COMPARATIVE EXAMPLE 3

Figure 14:
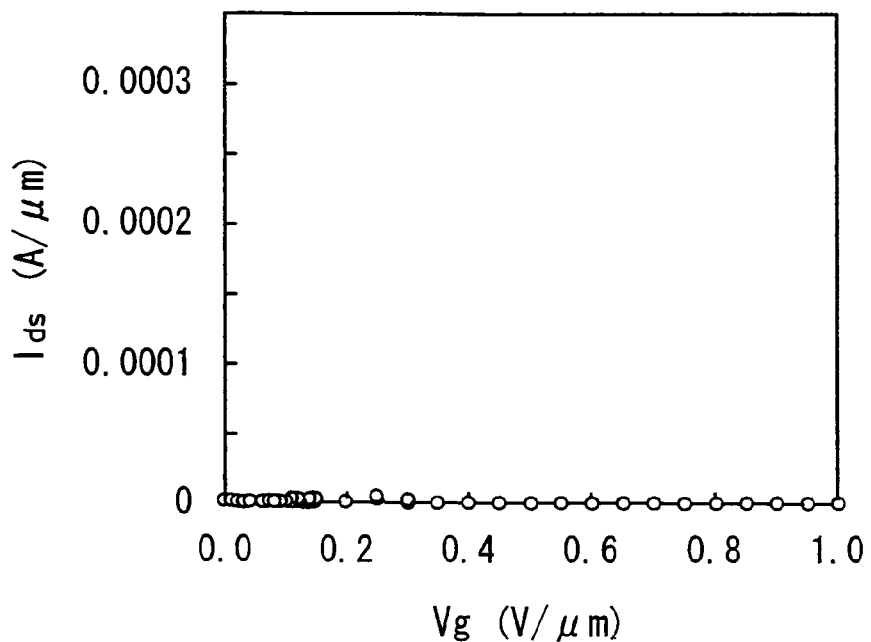
FIG. 14 is a graph showing the relationship between the applied electric field and the current density of a dummy field-effect molecular device of comparative example 3.

The 4-pentyl-4'-cyanobiphenyl-silver (I) complex introduced between the substrates was replaced with only 4-pentyl-4'-cyanobiphenyl, the polypyrrole film fabricated in specific embodiment 1 was not fabricated, but a dummy field-effect molecular device that does not include a polypyrrole film or silver (I) ions was otherwise fabricated in the same way as specific embodiment 1, and in the same way as specific embodiment 3, the current density was measured while changing the applied control electric field to investigate the conductivity of the structure. As shown in FIG. 14, changes due to the application of the electric field were not observed. It should be noted that the label "5CB only" at the top of FIG. 14 is a note showing the constituents of the dummy field-effect molecular device (hereinafter, the same applies to other labels).

COMPARATIVE EXAMPLE 4

Figure 15:
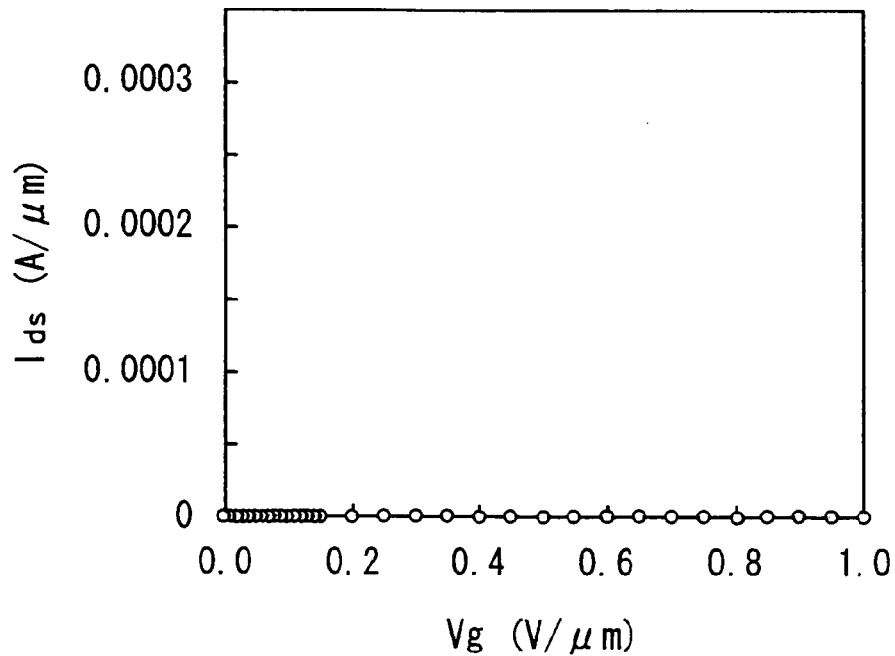
FIG. 15 is a graph showing the relationship between the applied electric field and the current density of a dummy field-effect molecular device of comparative example 4.

The polypyrrole film fabricated in specific embodiment 1 was not fabricated, but a 4-pentyl-4'-cyanobiphenyl-silver (I) complex was introduced between the substrates and a dummy field-effect molecular device that does not include a polypyrrole film was otherwise fabricated in the same way as specific embodiment 1, and in the same way as specific embodiment 3, the current density was measured while changing the applied control electric field to investigate the conductivity of the structure. As shown in FIG. 15, changes due to the application of the electric field were not observed.

COMPARATIVE EXAMPLE 5

Figure 16:
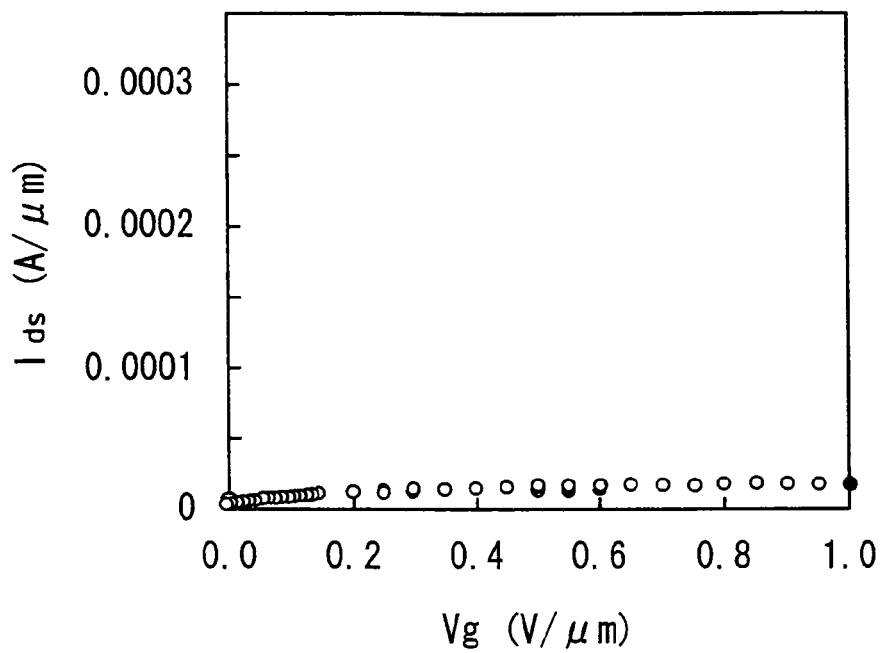
FIG. 16 is a graph showing the relationship between the applied electric field and the current density of a dummy field-effect molecular device of comparative example 5.

The polypyrrole film fabricated in specific embodiment 1 was reduced after fabrication and a 4-pentyl-4'-cyanobiphenyl-silver (I) complex was not introduced between the substrates, but a dummy field-effect molecular device was otherwise fabricated in the same way as specific embodiment 1, and in the same way as specific embodiment 3, the current density was measured while changing the applied control electric field to investigate the conductivity of the structure. As shown in FIG. 16, changes due to the application of the electric field were not observed. It should be noted that the label "redPPy" represents "a reduced polypyrrole film" (this also applies to comparative example 6, described later).

COMPARATIVE EXAMPLE 6

Figure 17:
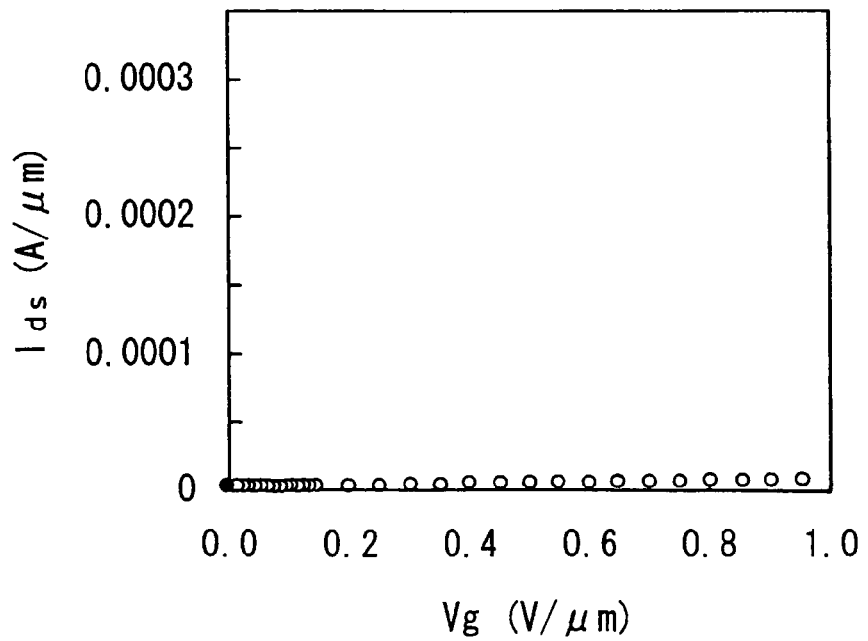
FIG. 17 is a graph showing the relationship between the applied electric field and the current density of a dummy field-effect molecular device of comparative example 6.

The polypyrrole film fabricated in specific embodiment 1 was reduced after fabrication, the 4-pentyl-4'-cyanobiphenyl-silver (I) complex introduced between the substrates was replaced with only 4-pentyl-4'-cyanobiphenyl, but a dummy field-effect molecular device was otherwise fabricated in the same way as specific embodiment 1, and in the same way as specific embodiment 3, the current density was measured while changing the applied control electric field to investigate the conductivity of the structure. As shown in FIG. 17, changes due to the application of the electric field were not observed.

By comparing comparative examples 3 to 6 and specific embodiment 3, it can be understood that to modulate the conductivity of a field-effect molecular device by applying an electric field, the conductivity of the polypyrrole film has an essential role, with the 4-pentyl-4'-cyanobiphenyl-silver (I) ion complex contributing to such conductivity.

Specific Embodiment 4

The polypyrrole-silver (I)—5CB complex fabricated in the same way as specific embodiment 1 was subjected to preprocessing (10 kHz, 100V, 1 hour) that applies a high frequency electric field before use, but aside from this, a field-effect molecular device 21B was fabricated in the same way as specific embodiment 1. As the time taken by application of the electric field for preprocessing, ten minutes or more is sufficient.

When an electric field $V_g$, which is applied between the first substrate 31 and the ITO film 36 that also serve as the control electric field applying electrodes of the field-effect molecular device 21B subjected to the pre-processing is gradually increased from zero, and a current density $I_{ds}$ flowing through the polypyrrole 22 between the comb-shaped electrodes 33 and 34 was measured under an AC bias voltage, the current density $I_{ds}$ when the electric field $V_g$ is off was high, but a modulating effect whereby the current density $I_{ds}$ gradually decreases in accordance with the increase in the applied voltage $V_g$ was observed. After this, although the current density increases as the applied electric field $V_g$ is gradually reduced, hysteresis was also observed.

Figure 18:
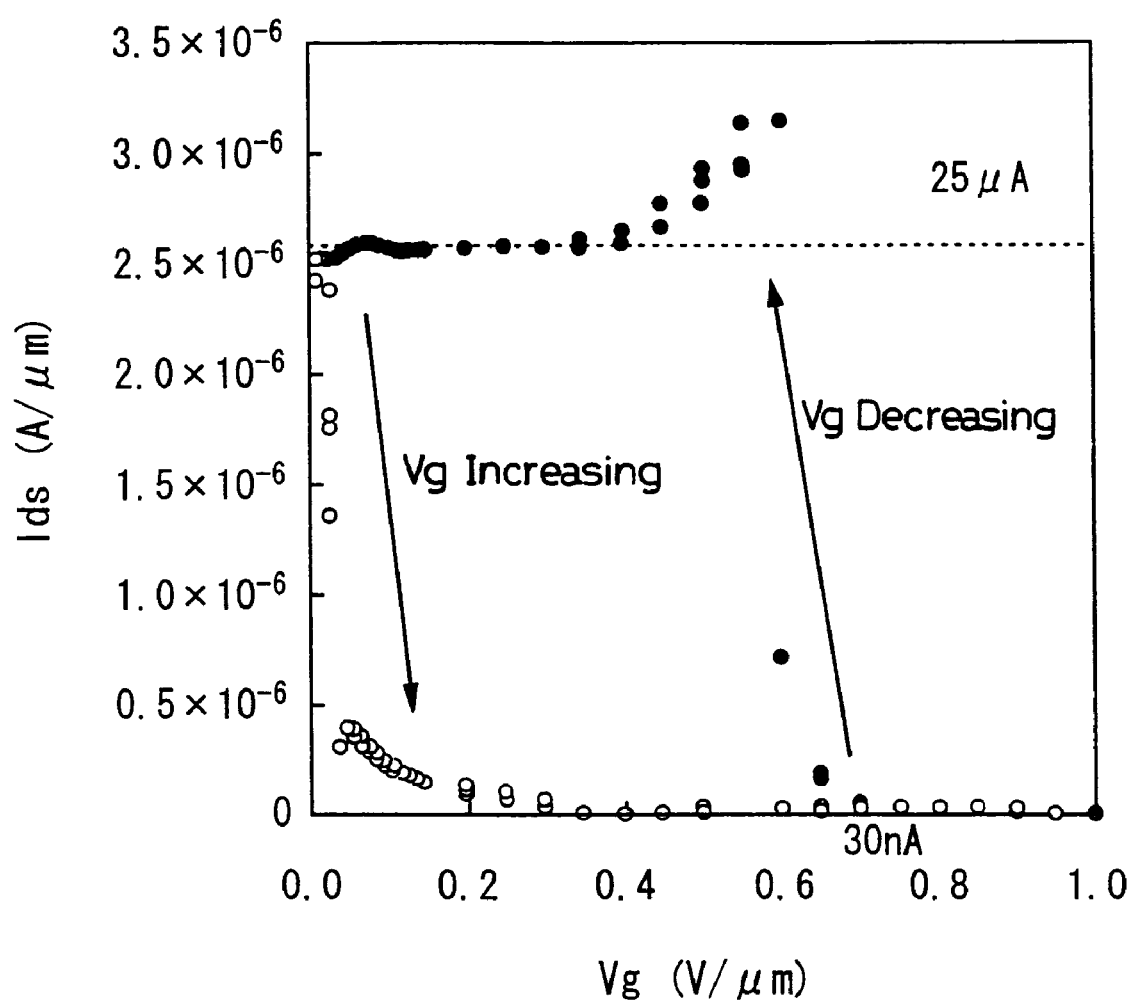
FIG. 18 is a graph showing the relationship between the current density flowing between the comb-shaped electrodes and the strength of the applied electric field of a field-effect molecular device 21B according to specific embodiment 4 of the present invention.

FIG. 18 is a graph showing the relationship between the size $V_g$ of the electric field and the current density $I_{ds}$ when a high frequency electric field of 10 kHz with a bipolar rectangular waveform has been applied between the first substrate 31 and the ITO film 36 that also serve as the control electric field applying electrodes of the field-effect molecular device 21B described above.

The modulating effect described above has the opposite tendency to the modulating effect observed for specific embodiments 1 and 3. The magnitude of the current density $I_{ds}$ itself also greatly differs to the cases of specific embodiments 1 and 3. It was therefore shown that the conductivity exhibited by a field-effect molecular device can be changed by carrying out preprocessing that applies a high-frequency electric field.

To clearly show the mode of action of the effect of applying a high-frequency electric field for preprocessing based on a measurement of an infrared absorption spectrum, calcium fluoride substrates were used as the first substrate 31 and the second substrate 35, transparent electrodes composed of transparent conductive films were provided on the substrates as the control electric field applying electrodes, and the comb-shaped electrodes 33 and 34 were not provided, but aside from this, a cell used for measuring the absorption spectrum with the same materials as the field-effect molecular device 21B was fabricated in the same way as the specific embodiment 1.

FIG. 19A and FIG. 19B are infrared absorption spectra respectively before and after the application of a pre-processing high frequency electric field to a cell used for measuring a light absorption spectrum. As shown in FIG. 19A, before the application of the pre-processing high frequency electric field, the $N^+H$ stretching vibration band (2337 cm$^{-1}$) that proves that σ complexes are formed between the polypyrrole and the silver (I) ions was weak. On the other hand, as shown in FIG. 19B, after the application of the pre-processing high frequency electric field, a high strength was observed for the $N^+H$ stretching vibration band (2337 cm$^{-1}$) that proves that σ complexes are formed between the polypyrrole and the silver (I) ions. Also, the CH stretching vibration band (3185 cm$^{-1}$) that proves that π complexes are formed was hardly observed.

Although the present invention has been described above by way of the embodiments and specific embodiments, it should be obvious that the present invention is not limited to such examples, and can be modified as appropriate without departing from the gist of the invention.

INDUSTRIAL APPLICABILITY

A functional molecular element based on a new mode of action for an electric field according to the present invention can be applied to various fields of electronic devices, such as switches, transistors, memories, and logic circuits, and makes it possible to fabricate everything from conventional micro size elements to nano-sized elements using the same materials and principles.

The invention claimed is:

1. A functional molecular element comprising:
   a molecule with permittivity anisotropy and/or a dipole moment;
   a metal ion; and
   a conjugated molecule,
   wherein the molecule with permittivity anisotropy and/or the dipole moment and the conjugated molecule form a complex with the metal ion, and wherein conductivity of the conjugated molecule is changed by changing an orientation of the molecule with the permittivity anisotropy and/or the dipole moment by an action of an electric field.

2. A functional molecular element according to claim 1, wherein the molecule with the permittivity anisotropy and/or the dipole moment is a Lewis base molecule.

3. A functional molecular element according to claim 1, wherein the metal ion is a Lewis acid.

4. A functional molecular element according to claim 1, wherein the conjugated molecule is polypyrrole.

5. A functional molecular element according to claim 1, wherein the molecule with the permittivity anisotropy and/or the dipole moment is 4-pentyl -4'-cyanobiphenyl.

6. A functional molecular element according to claim 1, wherein the metal ion is a silver ion.

7. A functional molecular device, comprising:
   a molecule with permittivity anisotropy and/or a dipole moment;
   a metal ion;
   a conjugated molecule, the molecule with permittivity anisotropy and/or the dipole moment and the conjugated molecule forming a complex with the metal ion;
   an electric field applying means that applies an electric field to the molecule with permittivity anisotropy and/or the dipole moment; and
   an input/output means for the conjugated molecule,
   wherein a conductive path is formed by the conjugated molecule and conductivity of the conductive path is controlled by changing an electric field that acts upon the molecule with the permittivity anisotropy and/or the dipole moment.

8. A functional molecular device according to claim 7, wherein the input/output means inputs and outputs electrons.

9. A functional molecular device according to claim 7, wherein the molecule with permittivity anisotropy and/or the dipole moment is oriented on an electrode for applying the electric field, the metal ion and the conjugated molecule are disposed at least between opposing electrodes, and an output corresponding to the electric field is taken from at least one of the opposing electrodes.

10. A functional molecular device according to claim 7, wherein before the electric field is applied, the conductivity of the conductive path is changed by applying a high frequency electric field to the complex.

11. A functional molecular device according to claim 7, wherein by changing the electric field that acts upon the molecule with permittivity anisotropy and/or the dipole moment, the positional relationship of the molecule with respect to an orientation of the electric field, the angle between the molecule and the conjugated molecule, an acting position of the metal ion, or a three-dimensional structure of the complex changes.

12. A functional molecular device according to claim 7, wherein a layer of the conjugated molecule and a layer of the molecule with permittivity anisotropy and/or the dipole moment form a multilayer structure.

13. A functional molecular device according to claim 12, wherein
an insulating layer is provided on a first electrode,
second and third electrodes are formed on the insulating layer so as to not contact one another,
the laminated structure is disposed at least between the second electrode and the third electrode, and
a fourth electrode is provided directly, or via an insulating layer, on the layer of the molecule with permittivity anisotropy and/or the dipole moment of the multilayer structure.

* * * * *